(12) United States Patent
Kim et al.

(10) Patent No.: US 11,812,666 B2
(45) Date of Patent: Nov. 7, 2023

(54) PIEZOELECTRIC ELEMENT, PIEZOELECTRIC DEVICE INCLUDING THE SAME, AND VIBRATION MODULE AND DISPLAY APPARATUS INCLUDING THE PIEZOELECTRIC DEVICE

(71) Applicants: LG Display Co., Ltd., Seoul (KR); Korea University Research and Business Foundation, Seoul (KR)

(72) Inventors: Taeheon Kim, Paju-si (KR); Sahn Nahm, Seoul (KR); YongGyoon Jang, Paju-si (KR); Jonghyun Kim, Seoul (KR); Ku-Tak Lee, Seoul (KR); Chiwan Kim, Paju-si (KR); Sung-Eui Shin, Paju-si (KR); YongWoo Lee, Paju-si (KR); Seok-June Chae, Changwon-si (KR)

(73) Assignees: LG Display Co., Ltd., Seoul (KR); Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/893,881

(22) Filed: Aug. 23, 2022

(65) Prior Publication Data
US 2022/0406989 A1 Dec. 22, 2022

Related U.S. Application Data

(62) Division of application No. 16/886,150, filed on May 28, 2020, now Pat. No. 11,462,675.

(30) Foreign Application Priority Data

May 29, 2019 (KR) .................. 10-2019-0063448

(51) Int. Cl.
*H10N 30/853* (2023.01)
*G06F 3/041* (2006.01)
(Continued)

(52) U.S. Cl.
CPC ....... *H10N 30/8542* (2023.02); *G06F 1/1605* (2013.01); *G06F 3/016* (2013.01); *G06F 3/0412* (2013.01); *G10K 9/122* (2013.01)

(58) Field of Classification Search
CPC ... H01L 41/1873; G06F 1/1605; G06F 3/016; G06F 3/0412; G06F 1/1688;
(Continued)

(56) References Cited

U.S. PATENT DOCUMENTS 8,076,828 B2 12/2011 Kawada
2011/0204754 A1* 8/2011 Kawada ............... H01L 41/083
310/366

(Continued)

FOREIGN PATENT DOCUMENTS

KR 10-2011-0057247 A 5/2011

*Primary Examiner* — Yaron Cohen
(74) *Attorney, Agent, or Firm* — Morgan, Lewis & Bockius LLP

(57) ABSTRACT

A piezoelectric element comprising a compound represented by Formula 1, a piezoelectric device including the piezoelectric element, a vibration module including the piezoelectric device, and a display apparatus including the piezoelectric device are provided, where $(1-x)(Li_zNa_{0.5-z}K_{0.5})(Nb_{1-y}Sb_y)O_3 \cdot xCaZrO_3$ [Formula 1]

where x, y, and z have a range of $0.001 \leq x \leq 0.2$, a range of $0 \leq y \leq 0.5$, and a range of $0 \leq z \leq 0.2$, respectively.

24 Claims, 23 Drawing Sheets

(51) Int. Cl.
   *G10K 9/122*   (2006.01)
   *G06F 1/16*    (2006.01)
   *G06F 3/01*    (2006.01)
(58) Field of Classification Search
   CPC ................. G06F 2200/1612; G10K 9/122; H04R 17/00; H04R 2499/15; H04R 2440/01; H10N 30/8542; H10N 30/2047
   See application file for complete search history.

(56) References Cited

U.S. PATENT DOCUMENTS

| | | | |
|---|---|---|---|
| 2011/0212382 A1* | 9/2011 | Randall | C01G 49/009 |
| | | | 264/618 |
| 2015/0002586 A1* | 1/2015 | Sumi | C04B 35/4682 |
| | | | 310/365 |
| 2019/0141456 A1* | 5/2019 | Dogiamis | B06B 1/0625 |

* cited by examiner

PIEZOELECTRIC ELEMENT, PIEZOELECTRIC DEVICE INCLUDING THE SAME, AND VIBRATION MODULE AND DISPLAY APPARATUS INCLUDING THE PIEZOELECTRIC DEVICE

CROSS-REFERENCE TO RELATED APPLICATIONS

This application is a divisional of U.S. patent application Ser. No. 16/886,150 filed on May 28, 2020, which claims the benefit of the Korean Patent Application No. 10-2019-0063448 filed on May 29, 2019, the entire disclosures of which are all incorporated by reference as if fully set forth herein.

BACKGROUND

Technical Field

The present disclosure relates to a piezoelectric element, a piezoelectric device including the same, and a vibration module and a display apparatus each including the piezoelectric device.

Discussion of the Related Art

Display apparatuses include a display panel for displaying an image and a speaker for providing a sound. When a speaker is disposed in a display apparatus, the speaker occupies a space, and due to this, the design and spatial disposition of the display apparatus are limited.

Examples of speakers applied to display apparatuses include actuators including a magnet and a coil. However, when an actuator is applied to a display apparatus, a thickness of the display apparatus is thickened. Therefore, piezoelectric elements and piezoelectric devices for realizing a thin thickness are attracting much attention as speakers of display apparatuses.

SUMMARY

Accordingly, embodiments of the present disclosure are directed to provide a piezoelectric element, a piezoelectric device including the same, and a vibration module and a display apparatus each including the piezoelectric device that substantially obviate one or more problems due to limitations and disadvantages of the related art.

An aspect of the present disclosure is directed to provide a piezoelectric element which does not include lead (Pb) and has an excellent piezoelectric characteristic.

Another aspect of the present disclosure is directed to provide a piezoelectric device including a piezoelectric element.

Another aspect of the present disclosure is directed to provide a vibration module and a display apparatus each including a piezoelectric device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and claims hereof as well as the appended drawings.

In an embodiment of the present disclosure, there is provided a piezoelectric element comprising a compound represented by Formula 1, $(1-x)(Li_zNa_{0.5-z}K_{0.5})(Nb_{1-y}Sb_y)O_3 \cdot xCaZrO_3$     [Formula 1]

where x, y, and z have a range of $0.001 \leq x \leq 0.2$, a range of $0 \leq y \leq 0.5$, and a range of $0 \leq z \leq 0.2$, respectively.

In another aspect, there is provided a piezoelectric device including a first electrode, a piezoelectric element layer on the first electrode, the piezoelectric element layer including a piezoelectric element, and a second electrode on the piezoelectric element layer, wherein the piezoelectric element is represented by Formula 1.

In another aspect, there is provided a vibration module including a first electrode, a piezoelectric element layer on the first electrode, a second electrode on the piezoelectric element layer, and a vibration member on the second electrode, wherein the piezoelectric element layer includes a piezoelectric element, and the piezoelectric element is represented by Formula 1.

In another aspect, there is provided a display apparatus including a display panel displaying an image and a piezoelectric device disposed on the display panel, wherein the piezoelectric device includes a first electrode, a piezoelectric element layer on the first electrode, and a second electrode on the piezoelectric element layer, the piezoelectric element layer includes a piezoelectric element, and the piezoelectric element is represented by Formula 1.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the various principles.

DETAILED DESCRIPTION

Figure 1:
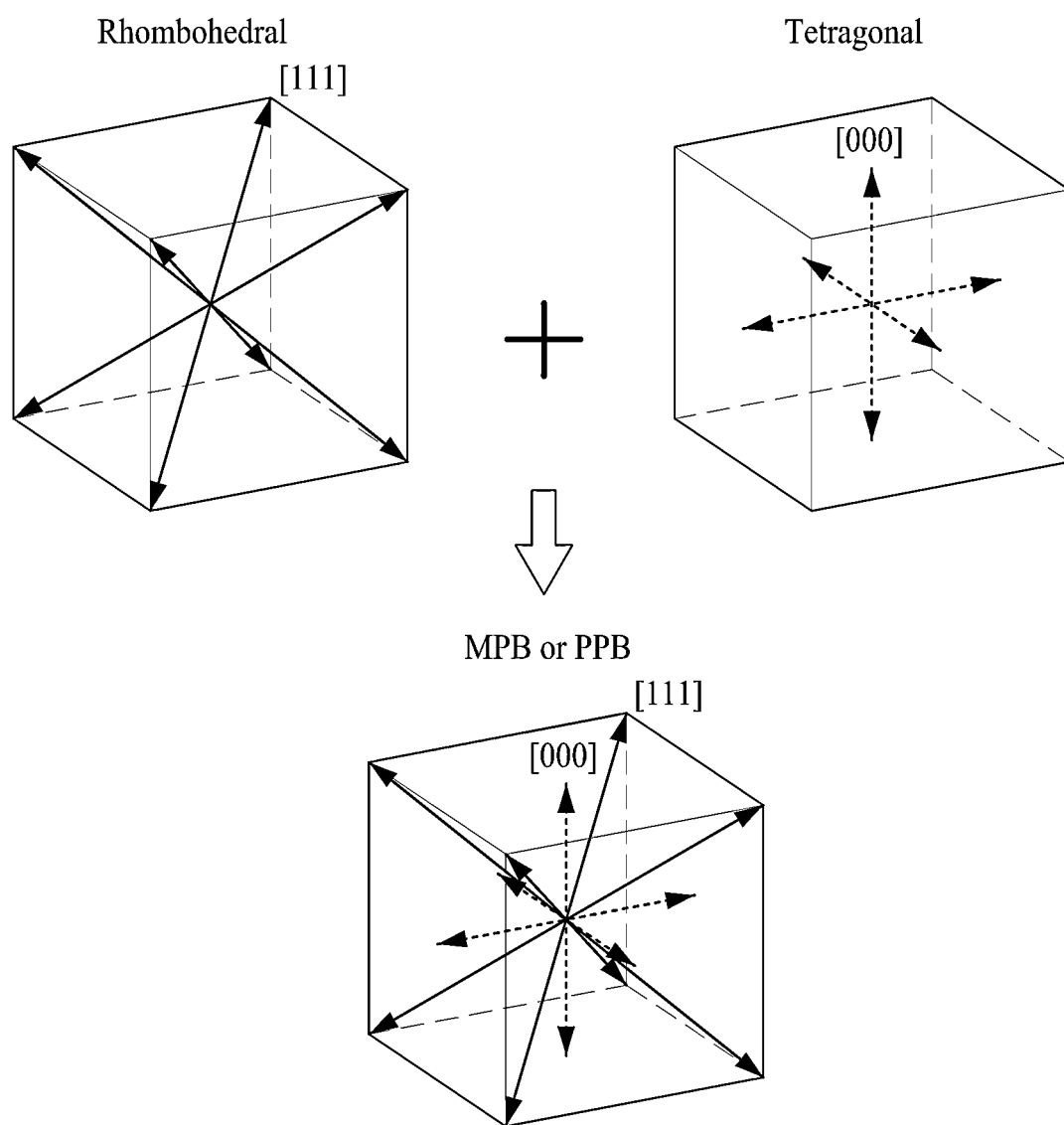
FIG. 1 illustrates a polarization direction based on a crystalline structure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where "comprise," "have," and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless "just" or "direct" is used.

In describing a time relationship, for example, when the temporal order is described as "after," "subsequent," "next," and "before," a case which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements.

FIG. 1 illustrates a polarization direction based on a crystalline structure.

In a perovskite crystalline structure, a position of a center ion may be changed by an external stress or a magnetic field to vary polarization, and a piezoelectric effect may be generated based on the variation or change of the polarization. In a perovskite crystalline structure including $PbTiO_3$, a position of a Ti ion corresponding to a center ion may be changed to vary polarization, and thus, a piezoelectric effect may be generated. For example, in the perovskite crystalline structure, a cubic shape having a symmetric structure may be changed to a tetragonal shape, an orthorhombic shape, or a rhombohedral shape each having an unsymmetric structure by an external stress or a magnetic field, and thus, a piezoelectric effect may be generated. Polarization may be high and easily realigned at a morphotropic phase boundary (MPB) of a tetragonal structure and a rhombohedral structure, having unsymmetric structures, and thus a high piezoelectric characteristic can be obtained in the perovskite crystalline structure.

With reference to FIG. 1, in a rhombohedral structure, polarization may be aligned in a [111] direction (a solid-line arrow direction), and in a tetragonal structure, polarization may be aligned in a [001] direction (a dotted-line arrow direction). When two phases having the rhombohedral structure and the tetragonal structure coexist, polarization may be formed in all of the [111] direction and the [001] direction. Therefore, in a case where a plurality of phases coexist in a piezoelectric element, when an electric field is applied to the piezoelectric element and thus polarization is aligned, alignment of polarization may be performed closer to a direction of the applied electric field than a case where the piezoelectric element has one phase. Therefore, in a case where a piezoelectric element has a morphotropic phase boundary (MPB) where a plurality of phases coexist, movement of a polarization direction may be freer, and thus, the piezoelectric element may have a larger piezoelectric constant. Therefore, when a piezoelectric element has a large piezoelectric constant, displacement in an electric field direction may increase, and thus, the piezoelectric element may have an excellent vibration characteristic. Accordingly, the piezoelectric element may be applied to various vibration devices or display apparatuses including a vibration device.

Therefore, a piezoelectric element corresponding to a morphotropic phase boundary (MPB) which is a boundary where a plurality of phases coexist should be implemented for enhancing a vibration characteristic. When a plurality of phases coexist in a piezoelectric element, polarization may be efficiently performed, and thus, when an electric field is applied, displacement of the piezoelectric element in a certain direction (for example, a thickness direction (a z direction)) may increase. Therefore, the piezoelectric element may have a large piezoelectric constant $d_{33}$. A piezoelectric element having a large piezoelectric constant may generate a large vibration with low power, thereby decreasing the power consumption of a product with the piezoelectric element applied thereto. Also, a piezoelectric element having a large piezoelectric constant may generate a large vibration with a thin thickness, thereby decreasing a thickness of a product with the piezoelectric element applied thereto.

A piezoelectric element having a high piezoelectric constant may include, for example, lead zirconium titanate (Pb—Zr—Ti) (PZT)-based ceramic. A piezoelectric element including the PZT-based ceramic may have a high piezoelectric characteristic. It may, however, cause environmental pollution problems since the piezoelectric element includes lead (Pb).

A piezoelectric element (or a lead-free piezoelectric element) without lead (Pb) may include, for example, barium zirconate titanate-barium calcium titanate (BCT-BZT)-based ceramic. However, the piezoelectric element including the BCT-BZT-based ceramic may have a low Curie temperature (Tc), and due to this, may have a limitation in excellent piezoelectric characteristic. As another example, a piezoelectric element (or a lead-free piezoelectric element) without lead (Pb) may include, for example, a Na—K—Nb (NKN)-based ceramic material. The piezoelectric element including the NKN-based ceramic material may have a low piezoelectric characteristic, and due to this, it may be difficult to apply the piezoelectric element to a display apparatus.

A piezoelectric constant representing a piezoelectric characteristic may be affected by a morphotropic phase temperature. A change of a phase transition temperature of a piezoelectric element may move a morphotropic phase temperature. Therefore, a morphotropic phase region may be formed in a piezoelectric element at a desired temperature. Therefore, the morphotropic phase region of the piezoelectric element is formed at a desired temperature by changing the morphotropic phase temperature. Also, forming the morphotropic phase region at a desired temperature by changing the morphotropic phase temperature or a boundary of a plurality of phases may be referred to as a polymorphic phase boundary (PPB). When a PPB is formed, a plurality of phases may coexist in one material. This will be described below with reference to FIG. 2.

Figure 2:
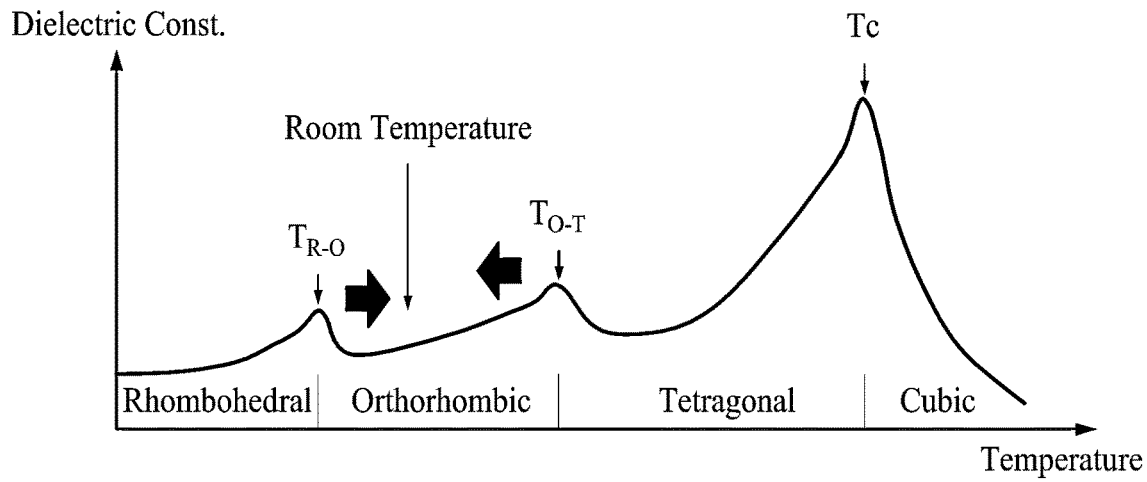
FIG. 2 is a diagram for describing a polymorphic phase boundary (PPB).

FIG. 2 is a diagram for describing a polymorphic phase boundary (PPB).

With reference to FIG. 2, a morphotropic phase temperature $T_{R-T}$ of a rhombohedron structure and an orthorhombic structure and a morphotropic phase temperature $T_{O-T}$ of an orthorhombic structure and a tetragonal structure may move. Based on the morphotropic phase temperature $T_{R-T}$ and the morphotropic phase temperature $T_{O-T}$, a morphotropic phase boundary (MPB) between a rhombohedral structure and the orthorhombic structure may meet a morphotropic phase boundary (MPB) between the orthorhombic structure and the tetragonal structure at room temperature, and thus, a PPB may be formed at room temperature. Accordingly, a piezoelectric element may have an excellent piezoelectric characteristic at room temperature.

As a composition of a piezoelectric element is changed, a morphotropic phase boundary (MPB) may vary, and thus, a PPB may be formed. The piezoelectric element may have a state where a plurality of phases coexists at a temperature, at which the PPB is formed. The piezoelectric element may have a polarization direction corresponding to each of the phases. Also, by adjusting the composition of the piezoelectric element, the PPB may be maintained despite a high temperature, and the piezoelectric element may have an excellent piezoelectric characteristic despite the high temperature.

The present inventors have recognized that a piezoelectric characteristic is enhanced when the piezoelectric element has various structures such as an orthorhombic structure, a tetragonal structure, a rhombohedral structure, and a pseudo-cubic structure. PZT-based ceramic may have an excellent piezoelectric characteristic, but may include Pb, causing a problem of environmental pollution. The present inventors have recognized that Na—K—Nb (NKN)-based ceramic has the orthorhombic structure but is lower in piezoelectric characteristic than the PZT-based ceramic. Also, the present inventors have recognized that a piezoelectric constant is affected by a temperature and the PZT-based ceramic and the Na—K—Nb (NKN)-based ceramic is difficult to maintain a piezoelectric characteristic at a high temperature.

Therefore, the present inventors have performed various experiments on a piezoelectric element which has a large piezoelectric constant and the PPB structure and maintains a piezoelectric characteristic at a high temperature. Through the various experiments, the present inventors have invented a piezoelectric element having a new structure, which has the large piezoelectric constant and the PPB structure and maintains the piezoelectric characteristic at a high temperature.

According to an embodiment of the present disclosure, the present inventors have manufactured a Na—K—Nb (NKN)-based piezoelectric element without lead (Pb) and having the orthorhombic structure and have performed experiments thereon. When a piezoelectric element has the orthorhombic structure, a morphotropic phase temperature may cause the structure of the piezoelectric element to become a tetragonal structure, a rhombohedral structure, a pseudocubic structure, etc. For example, the Na—K—Nb (NKN)-based piezoelectric element may be $Na_{0.5}K_{0.5}NbO_3$. In the Na—K—Nb (NKN)-based piezoelectric element, the present inventors have recognized that a plurality of phases coexist when a molar ratio of sodium (Na) and potassium (K) is 0.5. For example, the Na—K—Nb (NKN)-based piezoelectric element may have the PPB structure where a plurality of phases such as an orthorhombic structure, a tetragonal structure, a rhombohedral structure, and a pseudocubic structure coexist. Through various experiments, it may be seen that, when Ca—Zr (CZ) is added to the Na—K—Nb (NKN)-based piezoelectric element so as to enhance a piezoelectric characteristic, a piezoelectric constant is enhanced. This is described below with reference to FIGS. 3A to 3I and 4.

FIGS. 3A to 3I are graphs of a temperature-dielectric constant of piezoelectric element according to an experimental example 1 and embodiments of the present disclosure. FIG. 4 is a graph of a piezoelectric constant $d_{33}$ with respect to an x value variation according to an experimental example 1 and embodiments of the present disclosure.

In FIGS. 3A to 3I and 4, below-described piezoelectric elements have been manufactured, and a dielectric constant and a Curie temperature Tc have been measured. A method of manufacturing a piezoelectric element does not limit the details of the present disclosure. Also, a time, a temperature, and a mesh size for each manufacturing a piezoelectric element do not limit the details of the present disclosure. Descriptions thereof may be identically applied to FIGS. 5A to 5O, 6, 7, 8A to 8E, 9, and 10. Also, the Curie temperature Tc has been calculated from a maximum temperature of a relative permittivity, in measuring a temperature characteristic of a dielectric constant by an impedance analyzer (Zurich instruments).

To manufacture a piezoelectric element, $Na_2CO_3$, $K_2CO_3$, $Nb_2O_5$, $Li_2CO_3$, $Sb_2O_5$, $CaCO_3$, and $ZrO_2$ which are oxides having a powder state were weighed in amounts based on a molar ratio of a corresponding composition and put in a nylon jar and have been mixed with ethanol which is a solvent (place and basis weight). The oxides having the powder state may be differently formed based on a piezoelectric element. For example, when $Na_{0.5}K_{0.5}NbO_3$ is manufactured, a piezoelectric element may be formed of $Na_2CO_3$, $K_2CO_3$, and $Nb_2O_5$.

Subsequently, ball milling was performed on the oxides having the powder state and ethanol which is a solvent, for 24 hours, thereby manufacturing a compound (primary ball milling).

Subsequently, the compound on which the ball milling had been performed for 24 hours was put into a dish and dried at 100° C. for about 3 hours (dry).

The dried compound was ground with a mortar, put into an electric furnace, and calcined at 850° C. for 3 hours, thereby manufacturing a phase-synthesized power (phase synthesis).

The phase-synthesized powder was mixed with copper oxide (CuO), and in order to make a small particle, ethanol which is a solvent was added thereto and ball milling was performed thereon for 72 hours, thereby manufacturing a compound (secondary ball milling). A content of CuO was 1 part by weight with respect to 100 parts by weight of the compound represented by Formula 1.

The compound on which the ball milling had been performed for 72 hours was put into a dish and dried at 100° C. for about 3 hours (dry).

By a net having a 40-mesh size, a dried powder which was ground small was filtered out, and then, a powder including particles having a particle size of 40 mesh or less was obtained (selection).

A selected powder was put into a circular mold and compressed with 100 kg/f, thereby manufacturing a molding element (compression molding).

The molding element was sintered for 6 hours within a temperature range of about 1,020° C. to about 1,120° C., thereby manufacturing a specimen (sintering).

An electric field was applied to the sintered specimen to align polarization (falling or polarizing). Accordingly, a piezoelectric element according to the experimental example 1 and an embodiment of the present disclosure was manufactured.

Figure 3A:
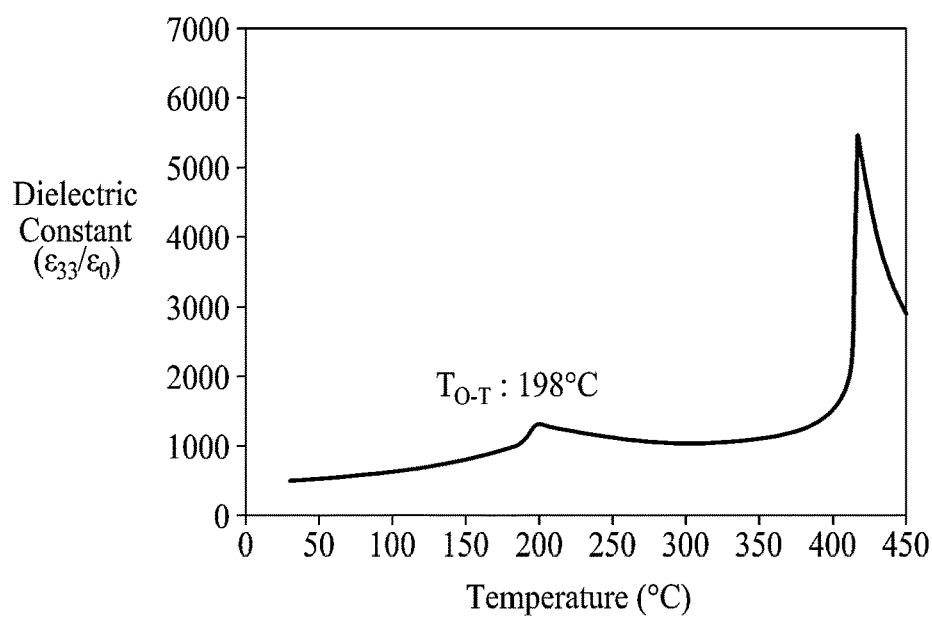
FIGS. 3A to 3I are graphs of temperature-dielectric constant of piezoelectric elements according to an experimental example 1 and embodiments of the present disclosure.
Figure 3B:
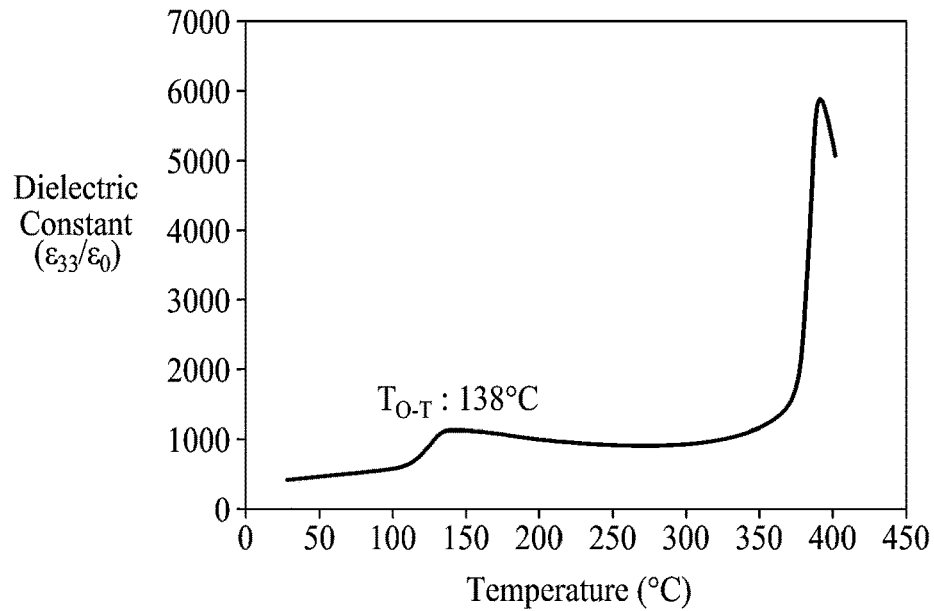
Figure 3C:
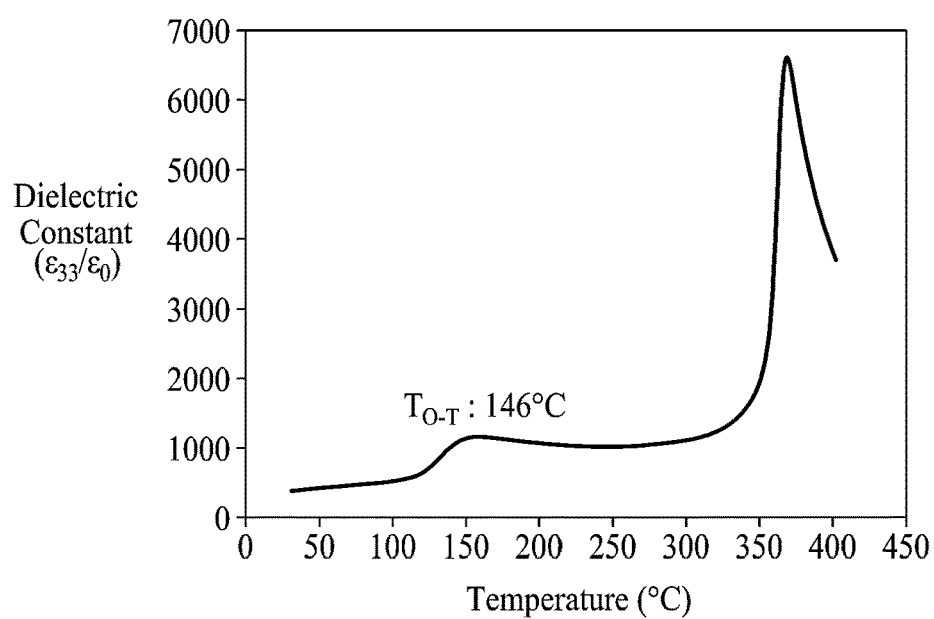
Figure 3D:
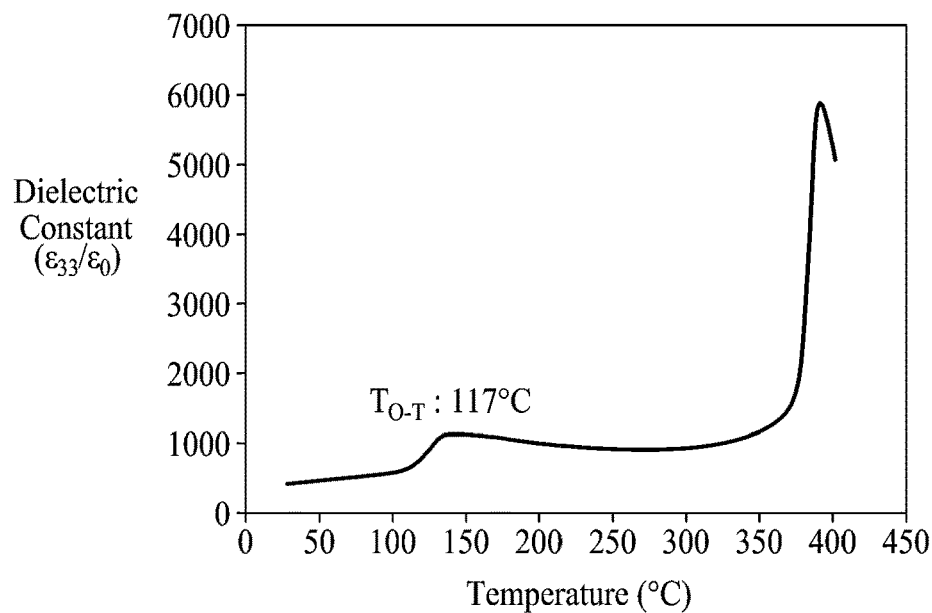
Figure 3E:
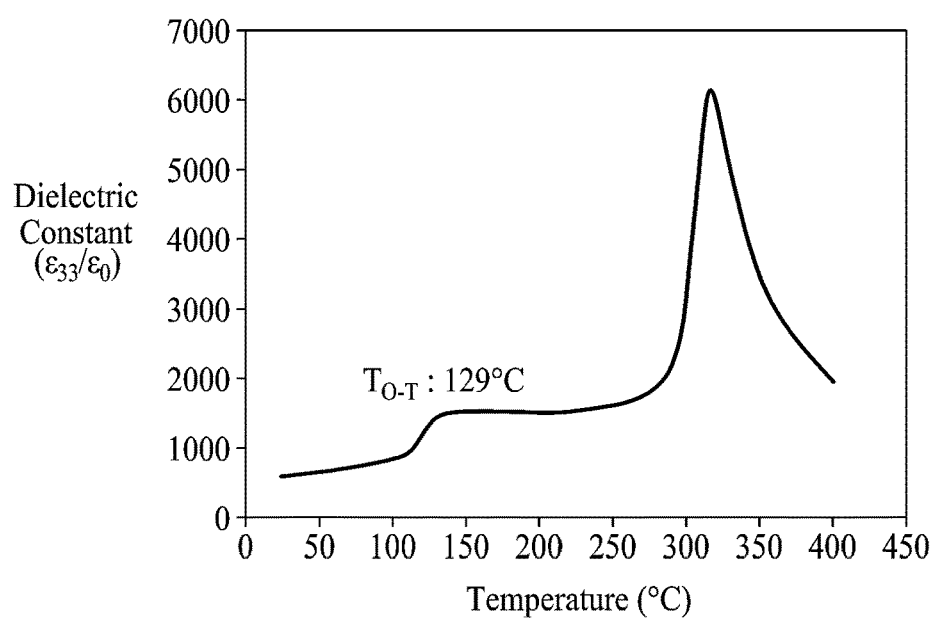
Figure 3F:
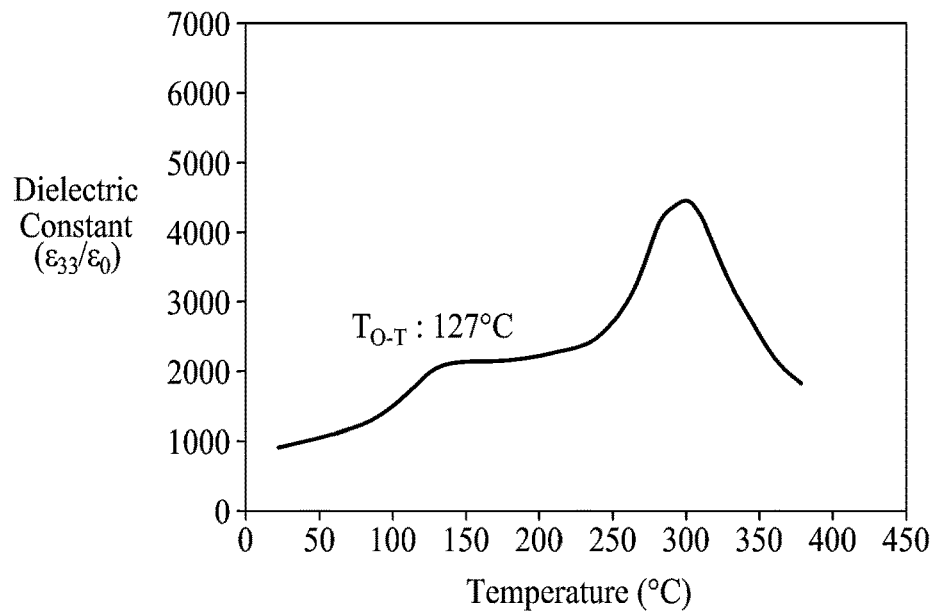
Figure 3G:
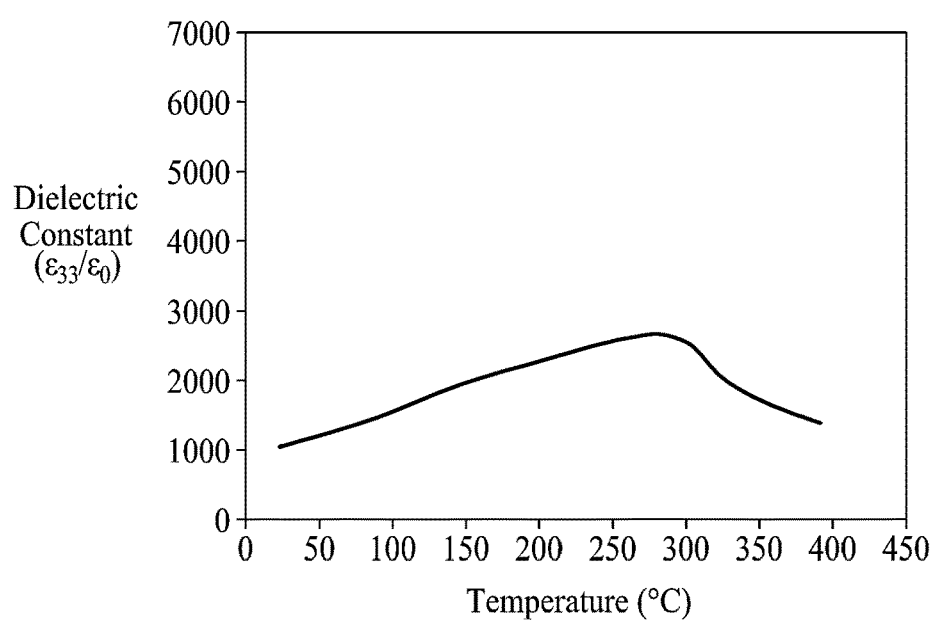
Figure 3H:
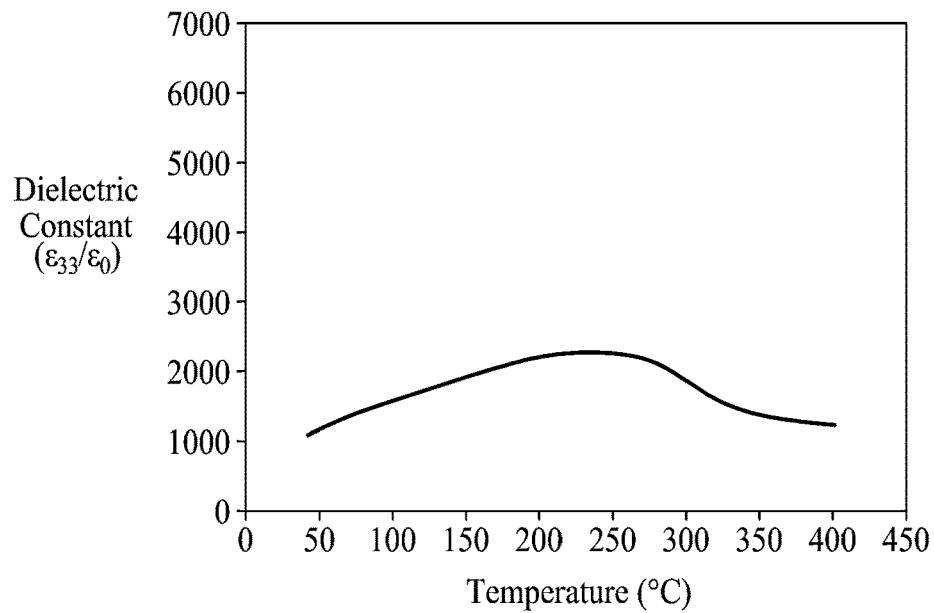
Figure 3I:
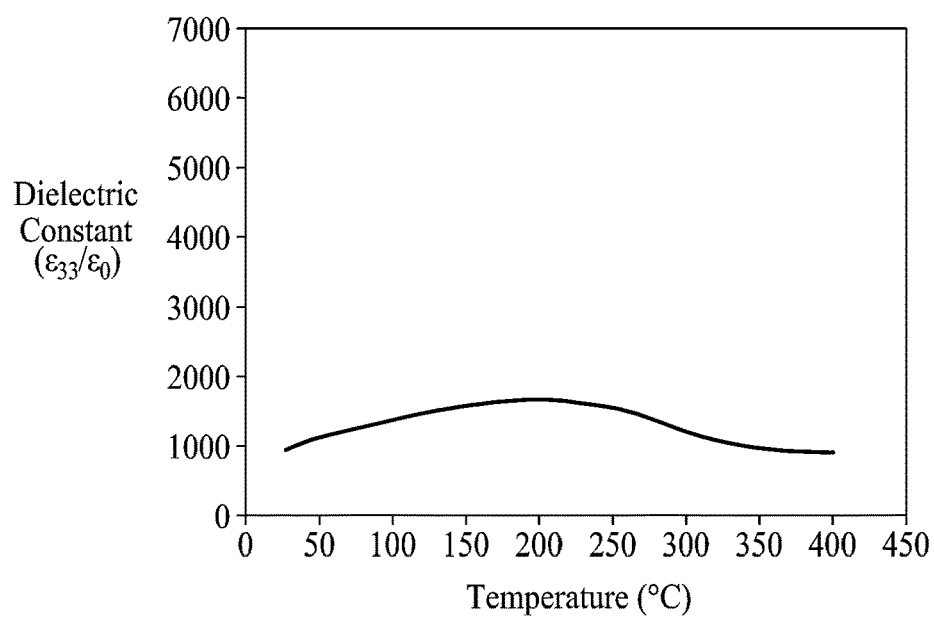
Figure 4:
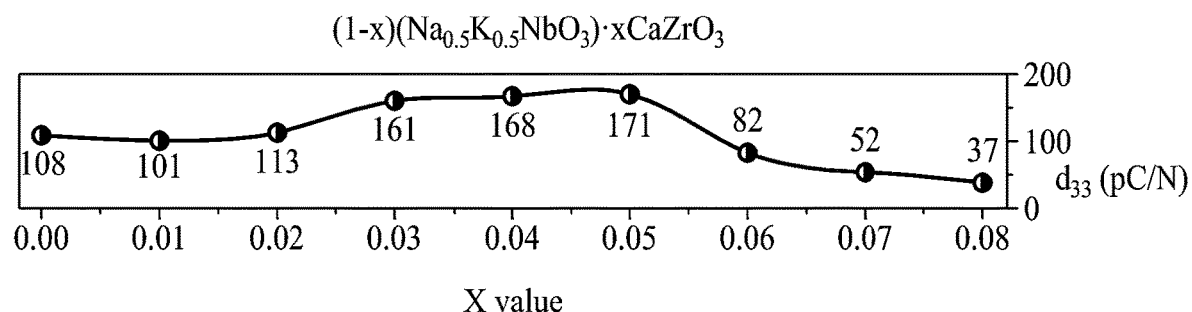
FIG. 4 illustrates a variation of a piezoelectric constant $d_{33}$ with respect to an x value variation according to an experimental example 1 and embodiments of the present disclosure.

In FIGS. 3A to 3I, piezoelectric elements are manufactured according to Formula 2, and a dielectric constant based on a temperature has been measured based on the amount of $CaZrO_3$. FIG. 4 shows a result obtained by measuring a piezoelectric constant $d_{33}$ based on the amount of $CaZrO_3$. For example, FIG. 3A represents an experimental example, and x is 0. FIGS. 3B to 3I represent embodiments 1 to 8 of the present disclosure respectively, and x is 0.01 to 0.08 respectively.

$$(1-x)(Na_{0.5}K_{0.5}NbO_3) \cdot xCaZrO_3 \qquad \text{[Formula 2]}$$

When a composition according to Formula 2 is sintered at a high temperature, Na and K may be respectively volatilized to $Na_2O$ and $K_2O$. Therefore, the present inventors have recognized that, despite accurate basis weight, due to the loss of Na and K in a sintering process, it is difficult to manufacture a piezoelectric element having a desired composition of Na and K. Therefore, the present inventors have performed various experiments for obtaining a method which, by lowering a sintering temperature and decreasing the amount of volatilized Na and K, prevents the amount of Na and K from being reduced after sintering. Through the various experiments, the present inventors have recognized that a sintering temperature of a piezoelectric element is lowered when CuO is added. It may be seen that the amount of volatilized Na and K is largely reduced, and thus, a composition ratio of Na and K is maintained as a certain ratio after sintering. Accordingly, in FIGS. 3A to 3I, CuO may be provided at 1 mol %. For example, a content of CuO may be 1 part by weight with respect to 100 parts by weight of Formula 1.

In a piezoelectric element manufactured in the experimental example 1 and the embodiments 1 to 8 of the present disclosure, Table 1 shows a measurement result of the piezoelectric constant $d_{33}$ and the Curie temperature Tc with respect to x values.

TABLE 1

| Division | x | $d_{33}$ (pC/N) | Tc (° C.) |
|---|---|---|---|
| Experimental example 1 | 0 | 108 | 416 |
| Embodiment 1 | 0.01 | 101 | 388 |
| Embodiment 2 | 0.02 | 113 | 367 |
| Embodiment 3 | 0.03 | 161 | 335 |
| Embodiment 4 | 0.04 | 168 | 318 |
| Embodiment 5 | 0.05 | 171 | 303 |

TABLE 1-continued

| Division | x | $d_{33}$ (pC/N) | Tc (° C.) |
|---|---|---|---|
| Embodiment 6 | 0.06 | 82 | 282 |
| Embodiment 7 | 0.07 | 52 | 238 |
| Embodiment 8 | 0.08 | 37 | 201 |

In FIGS. 3A to 3I, "$T_{O\text{-}T}$" may represent a morphotropic phase temperature of the orthorhombic structure and the tetragonal structure. As illustrated in FIGS. 3A to 3I, as a content of CaZrO$_3$ increases, a Curie temperature Tc of a piezoelectric element may decrease and the morphotropic phase temperature $T_{O\text{-}T}$ of the orthorhombic structure and the tetragonal structure may move to be close to room temperature. Therefore, a piezoelectric constant $d_{33}$ and a value of an electrical-mechanical coupling coefficient $k_{33}$ of the piezoelectric element may increase. This may occur because CaZrO$_3$ is applied to NKN-based materials, and due to this, a lattice defect occurs locally. The electrical-mechanical coupling coefficient $k_{33}$ may be a ratio of varied electric energy to applied electric energy. Therefore, when x which is a content of CaZrO$_3$ is less than 0.001, it may be seen that the Curie temperature Tc of the piezoelectric element increases. Also, as shown in FIGS. 3A to 3I, when a content of CaZrO$_3$ is 6 mol % or more (for example, when x is 0.06 or more), it may be seen that a piezoelectric constant is rapidly reduced, a morphotropic phase region of the orthorhombic structure and the tetragonal structure (for example, a $T_{O\text{-}T}$ region) is removed, and phase transition is performed in a cubic structure at room temperature. Accordingly, when an excessive amount of CaZrO$_3$ is substituted, it may be seen that a dielectric constant is reduced, and thus, it may be seen that a piezoelectric characteristic of the piezoelectric element is reduced.

In FIG. 4, a piezoelectric constant $d_{33}$ is obtained through measurement which has been performed for 6 hours at a sintering temperature of 1,020° C. to 1,060° C., and a sintering temperature and a sintering time do not limit the details of the present disclosure. The piezoelectric constant $d_{33}$ has been measured based on the amount of electric charge which are generated when a force of 0.25 Nrms is applied by using a $d_{33}$ meter (APCI wide range $d_{33}$ tester).

As illustrated in FIG. 4, when a Ca—Zr (CZ)-based material is added to a Na—K—Nb (NKN)-based material by 4 mol % (x=0.04), it may be seen that, comparing with pure NKN-based materials, a piezoelectric constant of about 160 pC/N is obtained.

Therefore, the present inventors have recognized that CuO acts as a low temperature sintering agent for lowering a sintering temperature of a piezoelectric element. Also, the present inventors have recognized that a content of CaZrO$_3$ should not be added by an excessive amount, for enhancing a piezoelectric characteristic. For example, when a content of CaZrO$_3$ is 5 mol % or less (for example, x is 0.05 or less), a piezoelectric characteristic may be enhanced.

When a piezoelectric constant is 150 pC/N or more or 200 pC/N or more, a piezoelectric element may have a sufficient piezoelectric characteristic and may be applied to a display apparatus or a vibration module. Through various experiments, the present inventors have recognized that antimony (Sb) is formed near an NKN-based material, for enhancing the piezoelectric constant. For example, a portion of niobium (Nb) may be substituted with antimony (Sb). Antimony (Sb) may be substituted with niobium (Nb) having an atomic size similar thereto. When Sb is substituted, the Curie temperature Tc may be rapidly reduced, and a PPB may be easily formed at room temperature. This will be described below with reference to FIGS. 5A to 5O, 6, and 7.

Figure 5A:
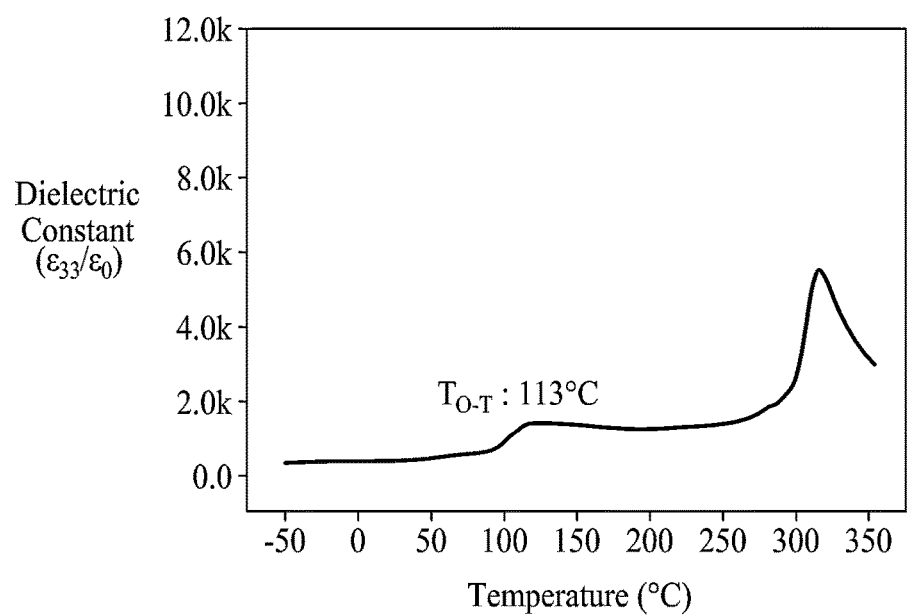
FIGS. 5A to 5O are graphs of temperature-dielectric constant of piezoelectric elements according to an embodiment of the present disclosure.
Figure 5B:
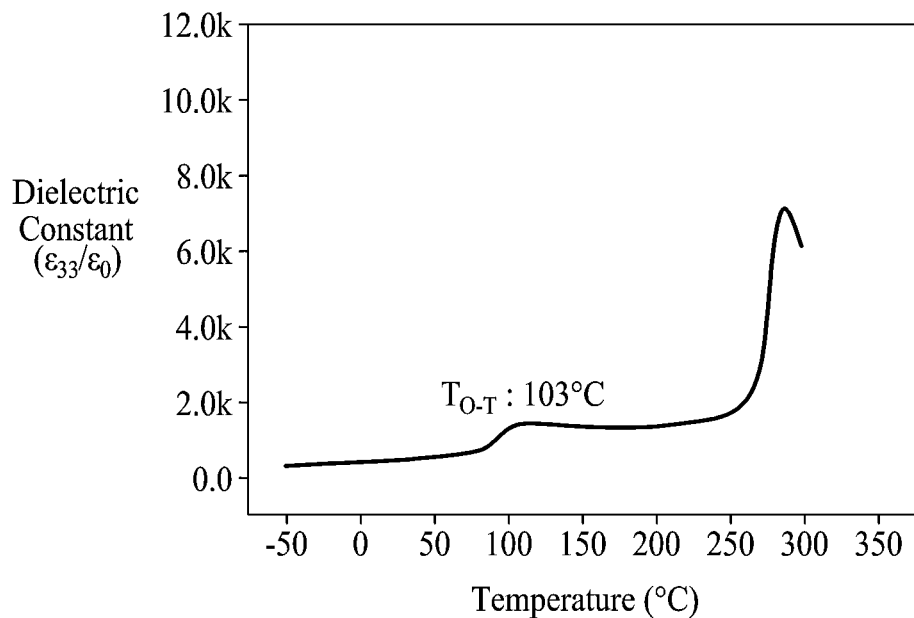
Figure 5C:
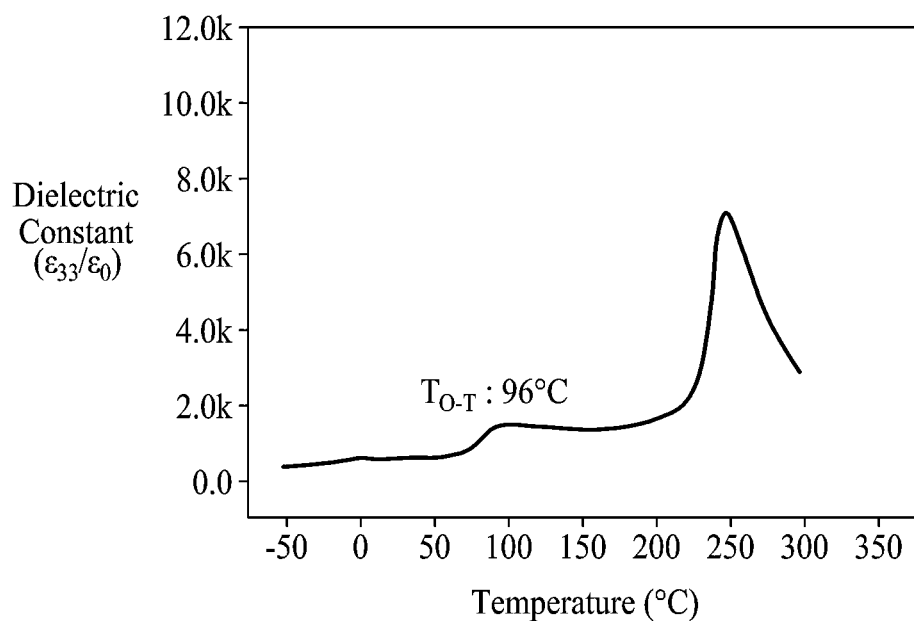
Figure 5D:
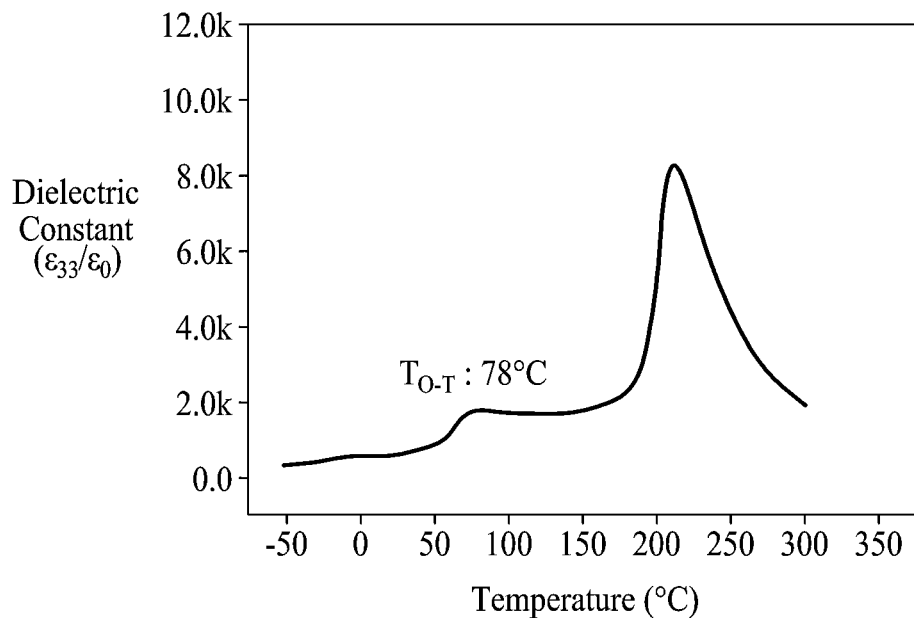
Figure 5E:
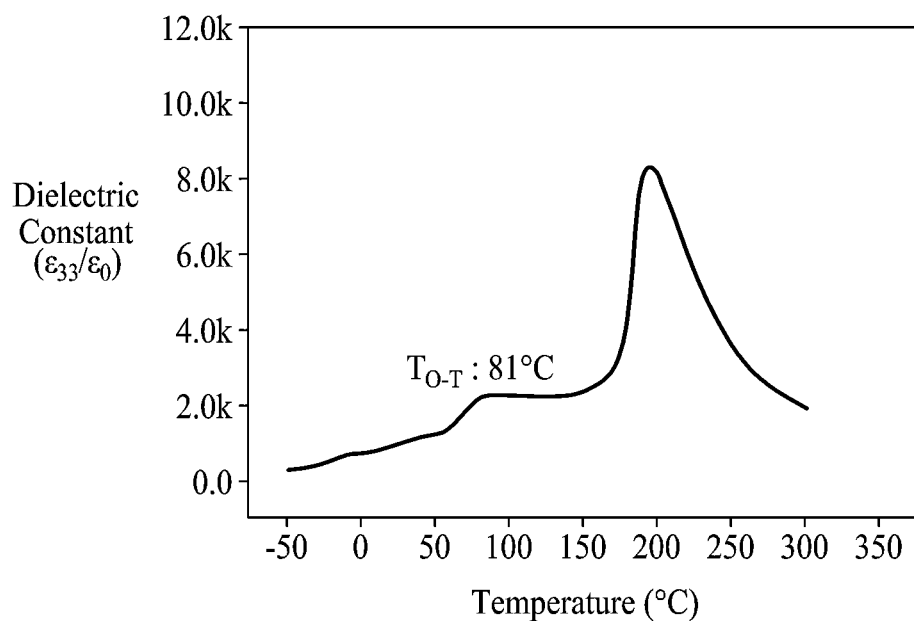
Figure 5F:
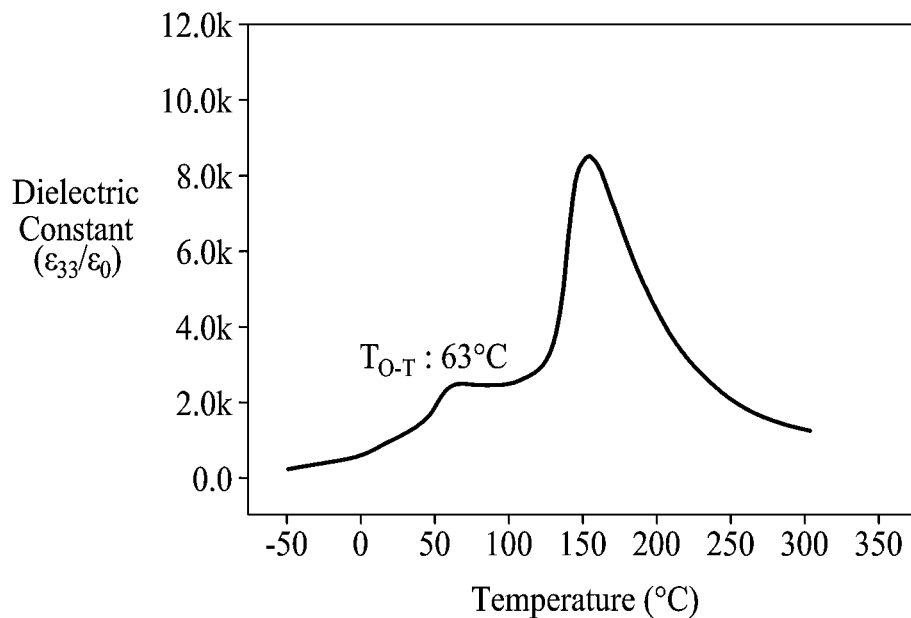
Figure 5G:
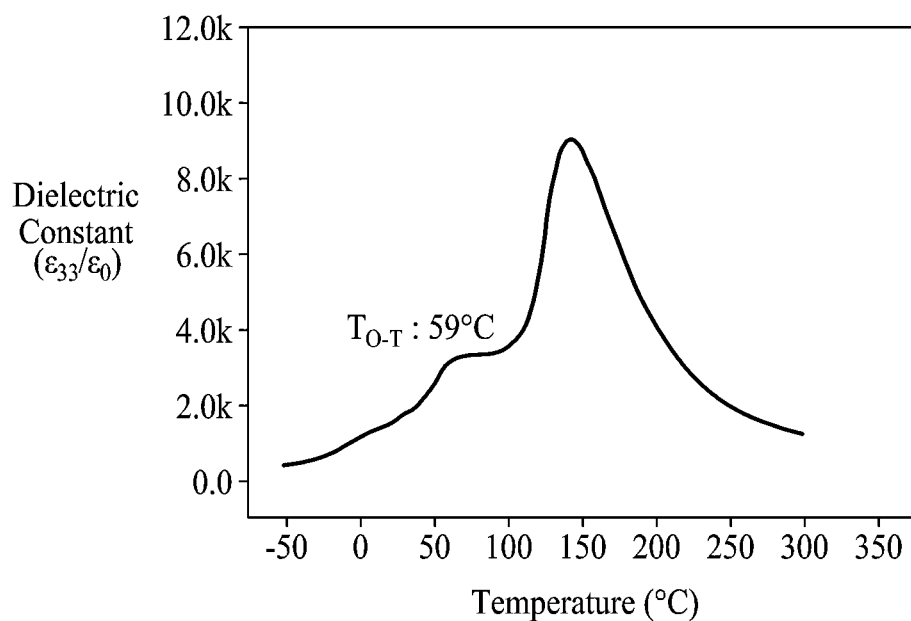
Figure 5H:
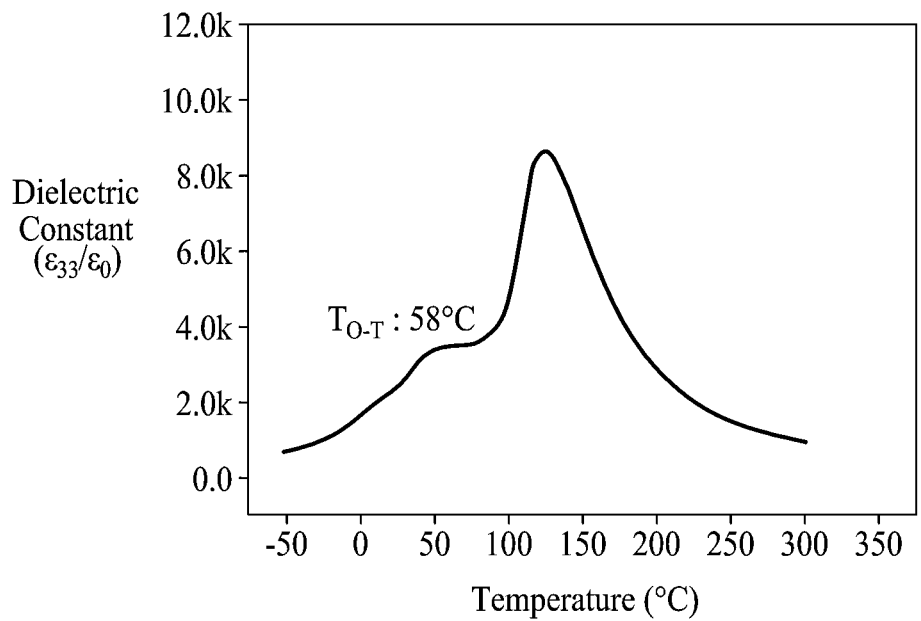
Figure 5I:
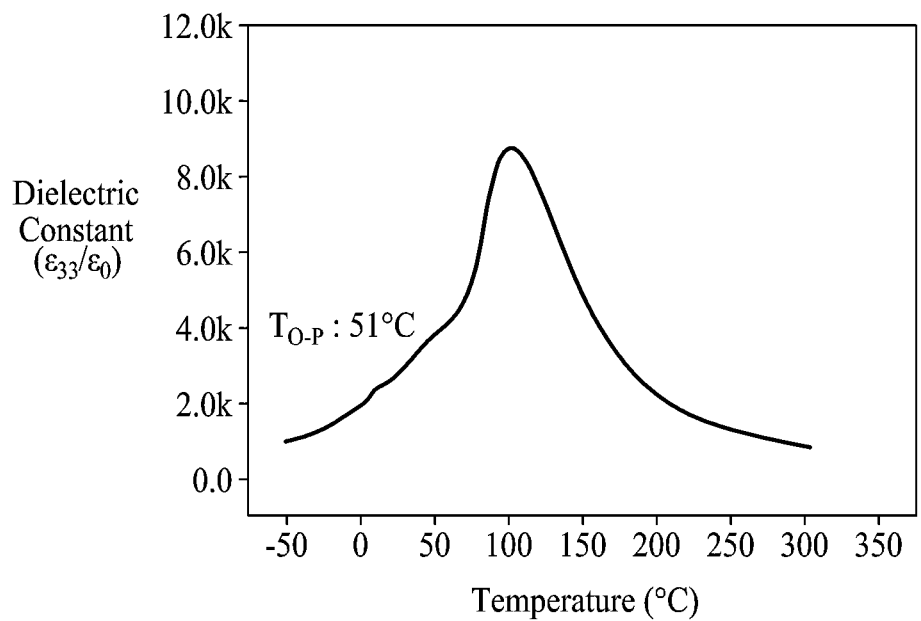
Figure 5J:
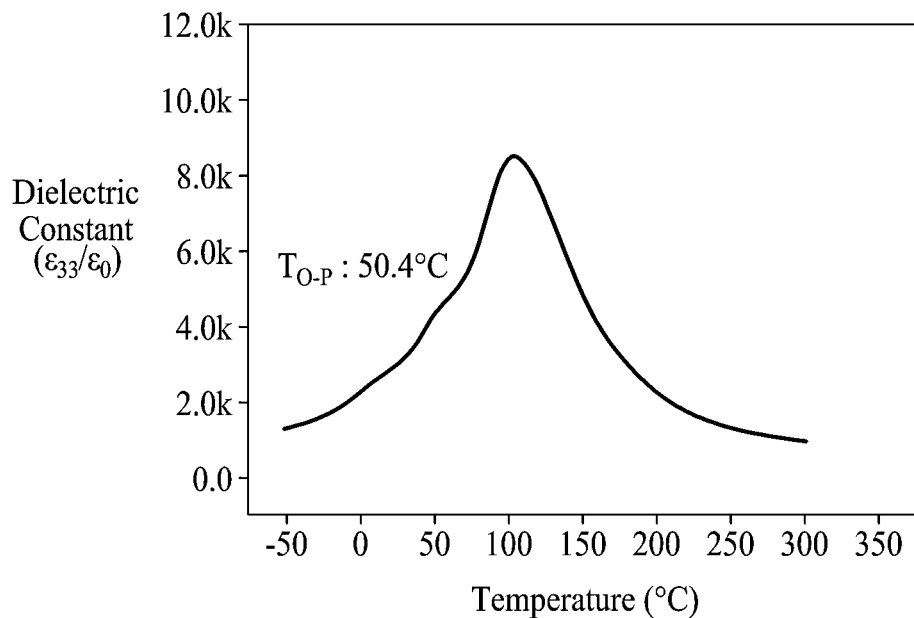
Figure 5K:
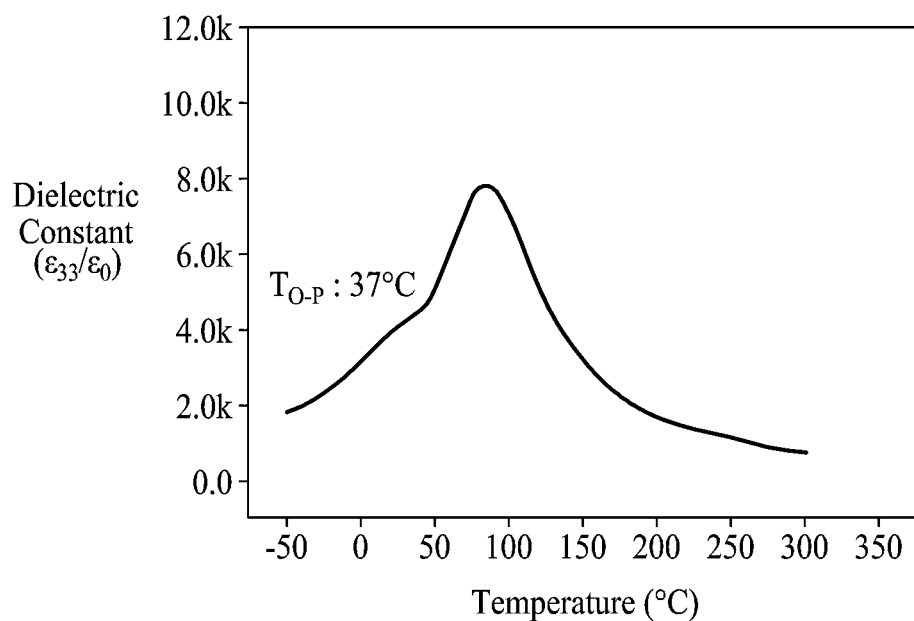
Figure 5L:
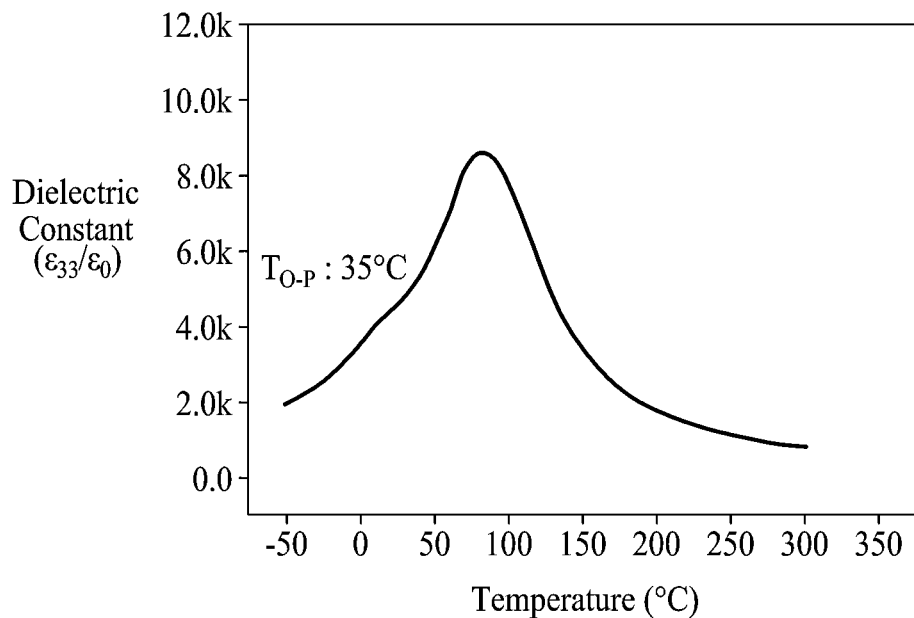
Figure 5M:
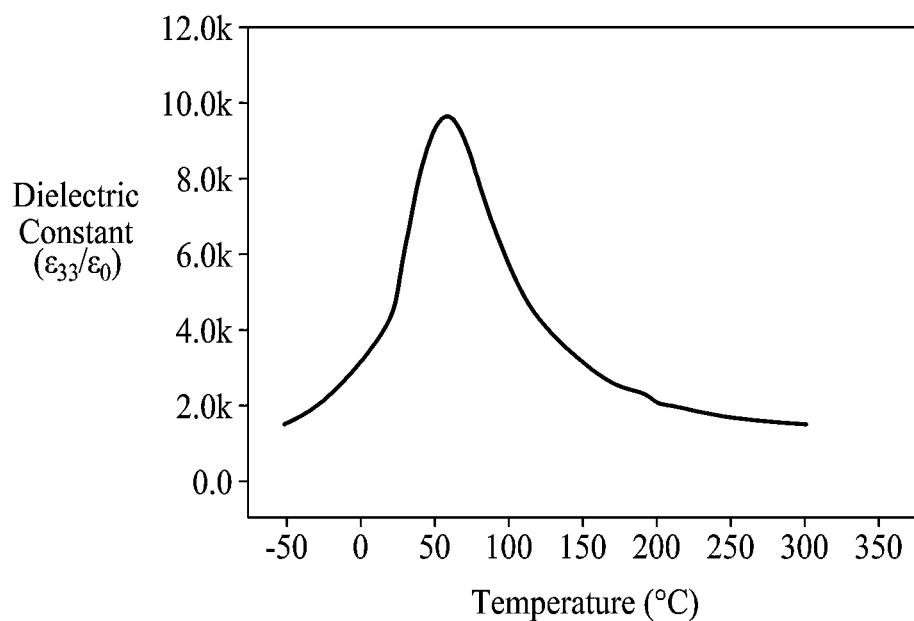
Figure 5N:
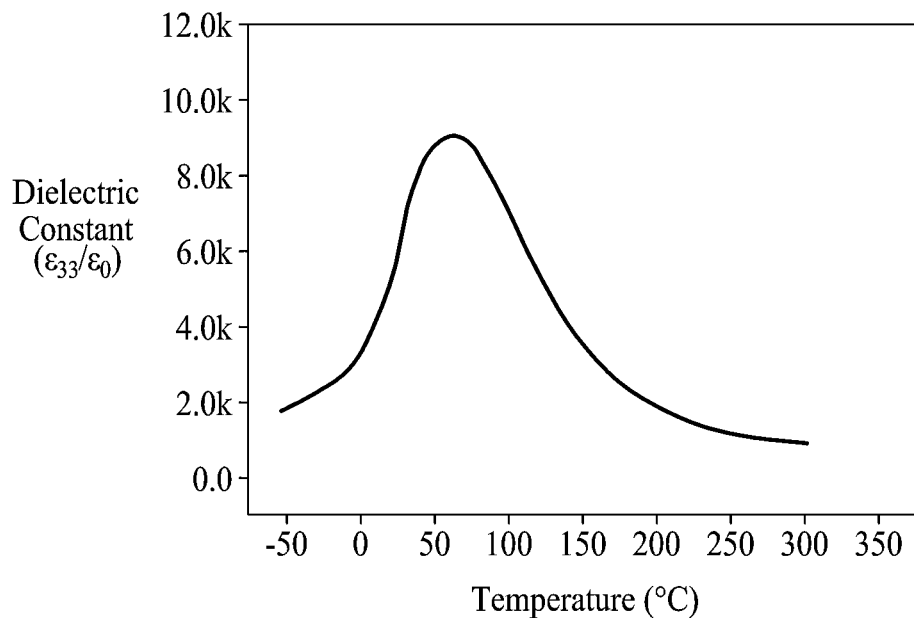
Figure 5O:
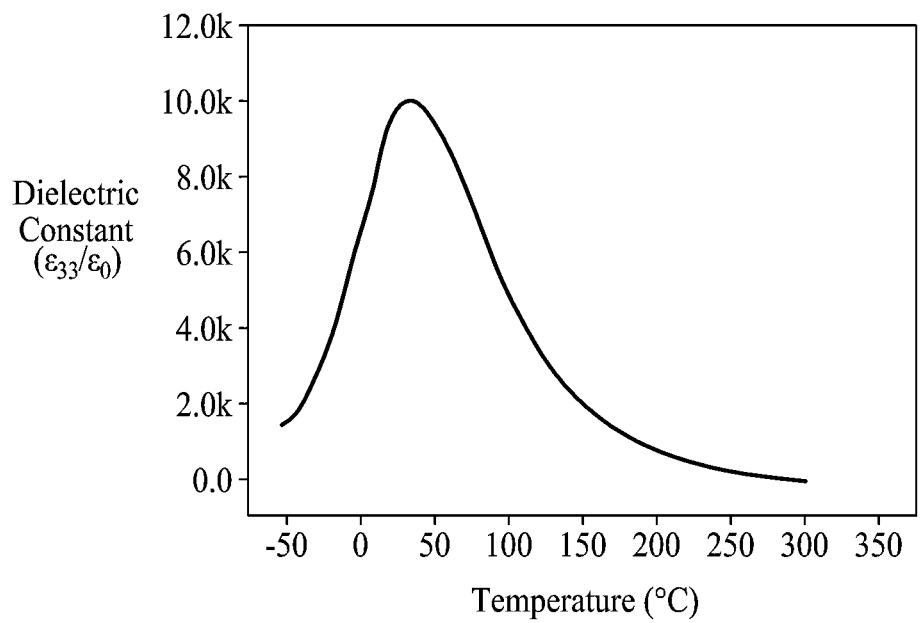
Figure 6:
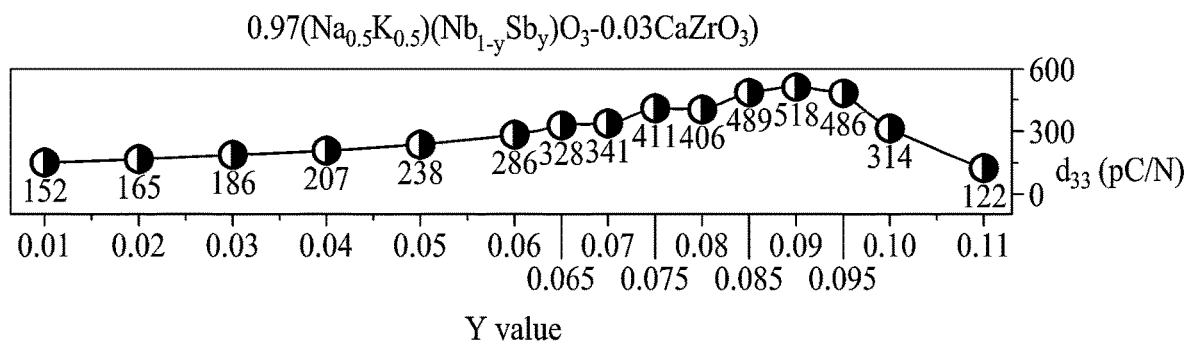
FIG. 6 illustrates a variation of a piezoelectric constant $d_{33}$ with respect to a y value variation in an embodiment of the present disclosure.

FIGS. 5A to 5O are graphs showing results obtained by measuring a dielectric constant of a piezoelectric element according to an embodiment of the present disclosure. FIG. 6 is a diagram showing a measurement result of a piezoelectric constant $d_{33}$ of a piezoelectric element according to an embodiment of the present disclosure.

According to an embodiment of the present disclosure, a portion of niobium (Nb) may be substituted with antimony (Sb), and a piezoelectric element may include a compound represented by Formula 3. A method of manufacturing the piezoelectric element may be the same as the descriptions of FIGS. 3A to 3I. Also, in embodiments 9 to 23 of the present disclosure, an example where an x value is 0.03 is described. When the x value is 0.03, a piezoelectric constant $d_{33}$ and a Curie temperature Tc with respect to a y value have been measured.

$(1-x)(Na_{0.5}K_{0.5})(Nb_{1-y}Sb_y)O_3 \cdot xCaZrO_3$     [Formula 3]

In a piezoelectric element manufactured in embodiments 9 to 23 of the present disclosure, Table 2 shows a measurement result of the piezoelectric constant $d_{33}$ and the Curie temperature Tc with respect to x values and y values. Also, as described above with reference to FIGS. 3A to 3I, CuO may be added by 1 mol %, for lowering a sintering temperature.

TABLE 2

| Division | x | y | $d_{33}$ (pC/N) | Tc (° C.) |
|---|---|---|---|---|
| Embodiment 9 | 0.03 | 0.01 | 152 | 313 |
| Embodiment 10 | 0.03 | 0.02 | 166 | 286 |
| Embodiment 11 | 0.03 | 0.03 | 186 | 248 |
| Embodiment 12 | 0.03 | 0.04 | 207 | 212 |
| Embodiment 13 | 0.03 | 0.05 | 238 | 196 |
| Embodiment 14 | 0.03 | 0.06 | 286 | 152 |
| Embodiment 15 | 0.03 | 0.065 | 328 | 141 |
| Embodiment 16 | 0.03 | 0.07 | 341 | 134 |
| Embodiment 17 | 0.03 | 0.075 | 411 | 103 |
| Embodiment 18 | 0.03 | 0.08 | 406 | 102 |
| Embodiment 19 | 0.03 | 0.085 | 489 | 84 |
| Embodiment 20 | 0.03 | 0.09 | 518 | 88 |
| Embodiment 21 | 0.03 | 0.095 | 486 | 59 |
| Embodiment 22 | 0.03 | 0.10 | 314 | 61 |
| Embodiment 23 | 0.03 | 0.11 | 122 | 50 |

In FIGS. 5A to 5O, "$T_{O\text{-}T}$" may represent a morphotropic phase temperature of the orthorhombic structure and the tetragonal structure, and "$T_{O\text{-}P}$" may represent a morphotropic phase temperature of the orthorhombic structure and the pseudocubic structure.

With reference to Table 2 and FIGS. 5A to 5O and 6, as a portion of Nb is substituted with Sb, and Sb is applied to a position of Nb, it may be seen that a Curie temperature Tc is rapidly lowered and the morphotropic phase temperature $T_{O\text{-}T}$ of the orthorhombic structure and the tetragonal structure is relatively slowly lowered. When a content of Sb increases, a region of the tetragonal structure is progressively narrowed, and when a content of Sb reaches a certain content (y=0.08) (embodiment 18), a region of the tetragonal structure is removed.

With reference to FIGS. 5A to 5O, the piezoelectric element may have the orthorhombic structure until y becomes 0.02 (y=0.02) (embodiments 9 and 10), and the piezoelectric element may have an orthorhombic-tetragonal PPB structure of the orthorhombic structure and the tetragonal structure within a range of 0.02<y≤0.06 (embodiments 11 to 14). The piezoelectric element may have an orthorhombic-tetragonal-pseudocubic PPB structure of the orthorhombic structure, the tetragonal structure, and the pseudocubic structure within a range of 0.06<y<0.08 (embodiments 15 to 17), and the piezoelectric element may have an orthorhombic-pseudocubic PPB structure of the orthorhombic structure and the pseudocubic structure within a range of 0.08≤y<0.095 (embodiments 18 to 20). When y is 0.095 or more (embodiments 21 to 23), the piezoelectric element may have the pseudocubic structure. For example, when y is more than 0.2, a phase may be removed, and thus, a piezoelectric characteristic may be removed. For example, when y is 0.07 to 0.2, the Curie temperature Tc may be lowered.

Figure 7:
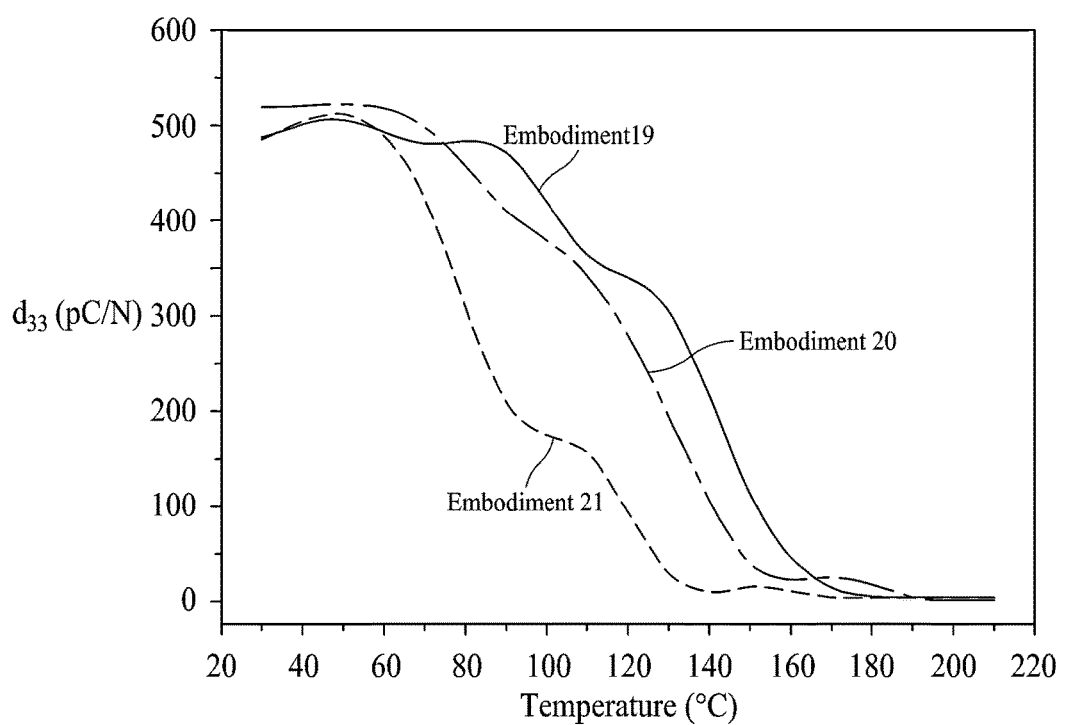
FIG. 7 illustrates a variation of a piezoelectric constant $d_{33}$ of a piezoelectric element with respect to an annealing temperature.
Figure 8A:
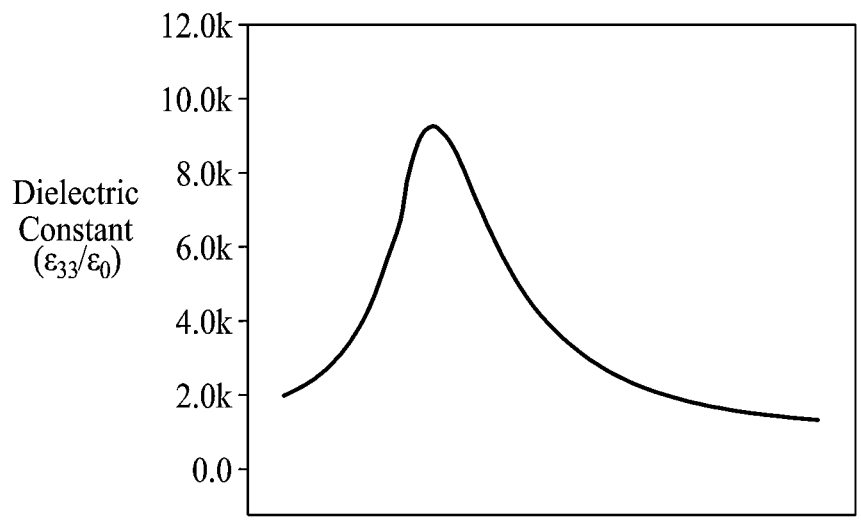
FIGS. 8A to 8E are graphs of temperature-dielectric constant of piezoelectric elements according to embodiments of the present disclosure.
Figure 8B:
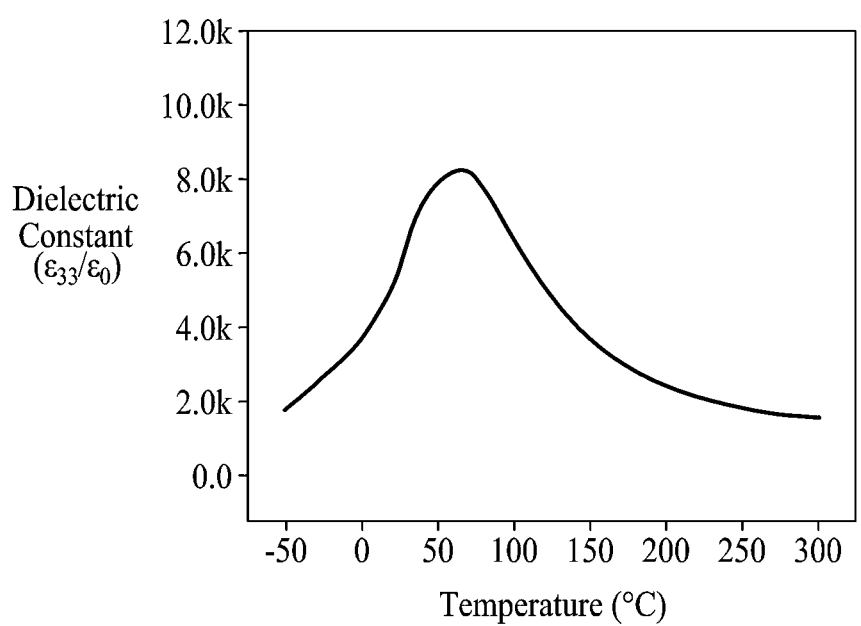
Figure 8C:
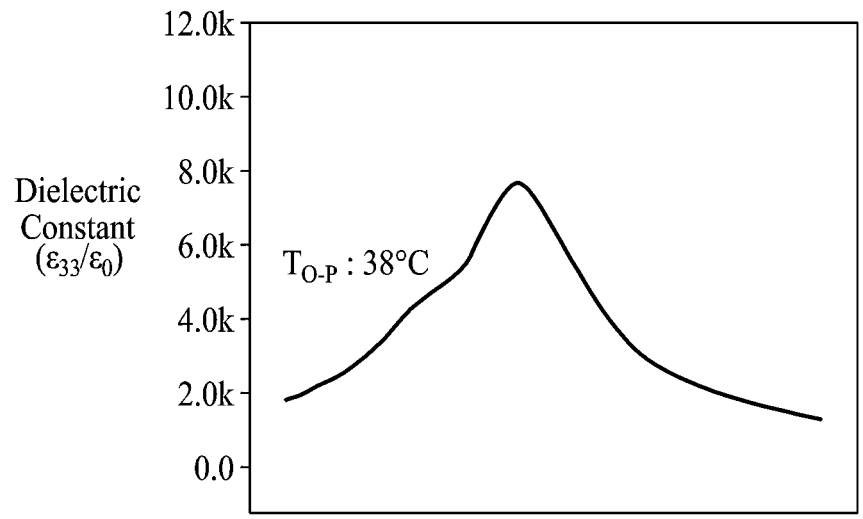
Figure 8D:
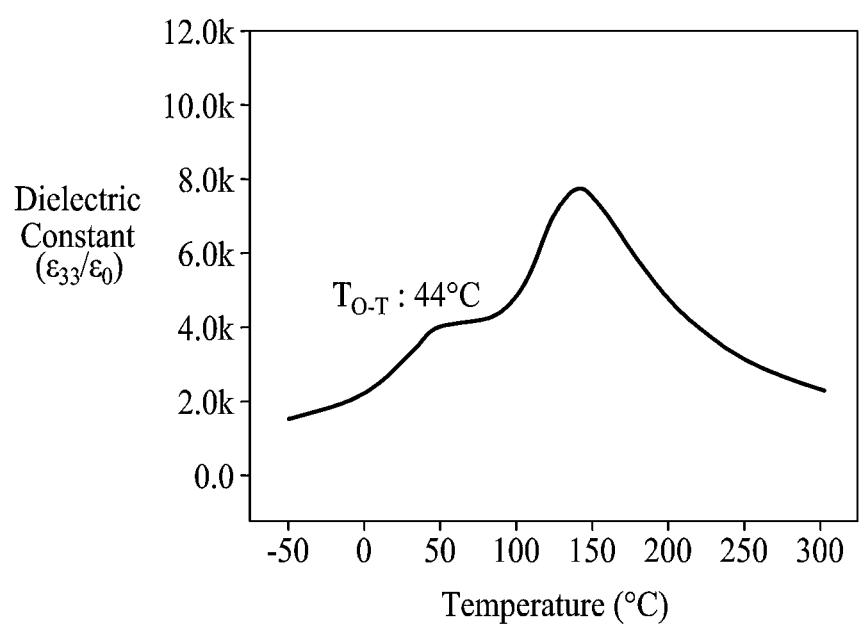
Figure 8E:
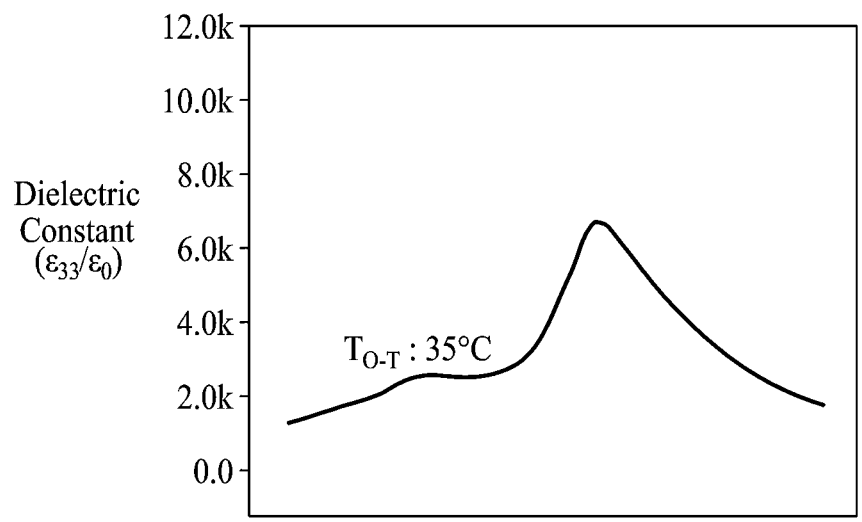

FIG. 7 illustrates a variation of a piezoelectric constant $d_{33}$ of a piezoelectric element with respect to an annealing temperature. For example, FIG. 7 is a graph showing a measurement result of a piezoelectric constant $d_{33}$ of a piezoelectric element with respect to an annealing temperature in an embodiment of the present disclosure. For example, FIG. 7 is a diagram showing a measurement result of a piezoelectric constant $d_{33}$ of a piezoelectric element according to embodiments 19, 20, and 21 of the present disclosure.

With reference to FIG. 7, it may be seen that a piezoelectric element of embodiment 20 where y representing the amount of Sb is 0.09 has a high piezoelectric constant of about 518 pC/N. It may be seen that the piezoelectric element of embodiment 20 having a high piezoelectric constant has an annealing temperature of about 88° C. Therefore, as shown in FIG. 7, it may be seen that a piezoelectric constant is about 500 pC/N at an annealing temperature of about 100° C. For example, when a piezoelectric element is applied to a mobile display apparatus and the like, a temperature of reliability measurement may be 80° C., and thus, the piezoelectric element may be easily applied thereto when the piezoelectric element has a piezoelectric characteristic at a low annealing temperature. The piezoelectric element according to an embodiment of the present disclosure may maintain an excellent piezoelectric characteristic despite a temperature (80° C.) of reliability measurement.

Therefore, when Sb is added to NKN-based materials, a piezoelectric constant may increase. For example, y which is the amount of Sb may have a morphotropic phase structure within a range of 0.02≤y≤0.06, and thus, a piezoelectric characteristic may be enhanced.

As described above with reference to FIGS. 5A to 5O, 6, and 7, when Sb is added, a piezoelectric constant may increase but a region of the tetragonal structure may be narrowed, and due to this, there is a problem where it is difficult to form a $T_{O-T}$ structure which is a morphotropic phase structure. Through various experiments, therefore, the present inventors have invented a structure where lithium (Li) is added for implementing the region of the tetragonal structure. For example, the present inventors have invented a structure where lithium (Li) is added for implementing the region of the tetragonal structure within a range of 0.07≤y≤0.2 corresponding to the amount of Sb having a low Curie temperature. When Li is added, Na having a similar atomic size may be substituted with Li. For example, a sum of a content of Li and a content of Na may be the same as a content of K. When Li is added to K, K may be difficult to be substituted with Li. When Na is substituted with an atom having a similar atomic size, as compared to when Na is substituted with an atom having a different atomic size, an increased amplitude of a Curie temperature Tc may be large, and thus, a PPB may be easily formed at room temperature. This will be described below with reference to FIGS. 8A to 8E, 9, and 10.

Figure 9:
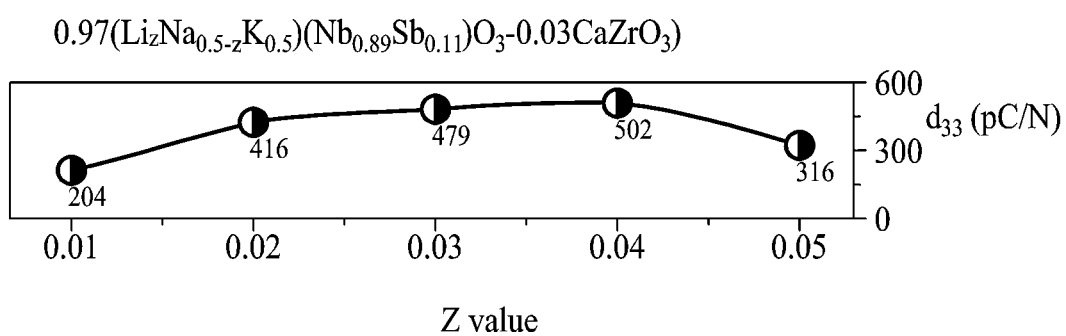
FIG. 9 illustrates a variation of a piezoelectric constant $d_{33}$ with respect to a z value variation according to an embodiment of the present disclosure.

FIGS. 8A to 8E are graphs showing results obtained by measuring dielectric constants of piezoelectric elements according to embodiments of the present disclosure. FIG. 9 is a diagram showing a measurement result of a piezoelectric constant $d_{33}$ of piezoelectric elements according to embodiments of the present disclosure.

According to an embodiment of the present disclosure, a portion of Na may be substituted with Li, and a piezoelectric element may include a compound represented by Formula 1. A method of manufacturing the piezoelectric element may be the same as the descriptions of FIGS. 3A to 3I. Also, in embodiments 24 to 28 of the present disclosure, an example where an x value is 0.03 and a y value is 0.11 will be described. When the x value is 0.03 and the y value is 0.11, a piezoelectric constant $d_{33}$ and a Curie temperature Tc with respect to a z value have been measured.

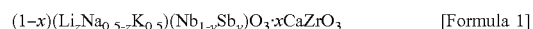
$(1-x)(Li_zNa_{0.5-z}K_{0.5})(Nb_{1-y}Sb_y)O_3 \cdot xCaZrO_3$      [Formula 1]

In Formula 1, a sum of a content of Li and a content of Na may be the same as a content of K.

Table 3 shows a measurement result of x, y, and z values, a piezoelectric constant $d_{33}$, and a Curie temperature Tc of a piezoelectric element manufactured in embodiments 24 to 28.

TABLE 3

| Division | x | y | z | $d_{33}$ (pC/N) | Tc (° C.) |
| --- | --- | --- | --- | --- | --- |
| Embodiment 24 | 0.03 | 0.11 | 0.01 | 204 | 52 |
| Embodiment 25 | 0.03 | 0.11 | 0.02 | 416 | 66 |
| Embodiment 26 | 0.03 | 0.11 | 0.03 | 479 | 101 |
| Embodiment 27 | 0.03 | 0.11 | 0.04 | 502 | 143 |
| Embodiment 28 | 0.03 | 0.11 | 0.05 | 316 | 155 |

In Table 3, all x may be 0.03, all y may be 0.11, and a piezoelectric element may include a compound represented by Formula 4.

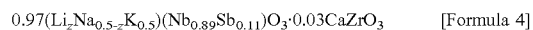
$0.97(Li_zNa_{0.5-z}K_{0.5})(Nb_{0.89}Sb_{0.11})O_3 \cdot 0.03CaZrO_3$      [Formula 4]

In FIGS. 8A to 8E, "$T_{O-T}$" may represent a morphotropic phase temperature of the orthorhombic structure and the tetragonal structure, and "$T_{O-P}$" may represent a morphotropic phase temperature of the orthorhombic structure and the pseudocubic structure.

FIG. 9 illustrates a variation of a piezoelectric constant $d_{33}$ with respect to a z value variation, in a piezoelectric element manufactured in embodiments 24 to 28 of the present disclosure.

In Table 3 and Formula 4, "z" represents a degree to which Na is substituted with Li.

In embodiments 24 to 28 of the present disclosure, in order to implement the tetragonal structure, a piezoelectric element has been manufactured by applying Li to a position of Na, with respect to a piezoelectric element composition (x=0.03 and y=0.11) of embodiment 23 having the pseudocubic structure.

With reference to Table 3 and FIGS. 8A to 8E and 9, when a content of Na and a content of Li increase, it may be seen that the tetragonal structure is again formed in the pseudocubic structure in the piezoelectric element, and thus, the Curie temperature Tc increases. With reference to FIGS. 8A to 8E, when z representing a content of Li is 0.02 to 0.03 (embodiments 25 and 26), a PPB structure of the orthorhombic structure and the pseudocubic structure is formed, and when z is 0.04 (embodiment 27), a PPB structure of the orthorhombic structure and the tetragonal structure is formed. Also, when z is 0.05 (embodiment 28), a PPB structure of the orthorhombic structure and the tetragonal structure is formed.

With reference to Table 3 and FIG. 9, when z is 0.04 (embodiment 27), the piezoelectric element may have a piezoelectric constant $d_{33}$ of 502 pC/N and a Curie temperature Tc of 143° C. For example, when z is more than 0.2, a phase may be removed, and thus, a piezoelectric characteristic may be removed. For example, when z is 0.01 to 0.05, the piezoelectric element may have a low Curie temperature Tc and a piezoelectric characteristic of the piezoelectric element may be enhanced.

Figure 10:
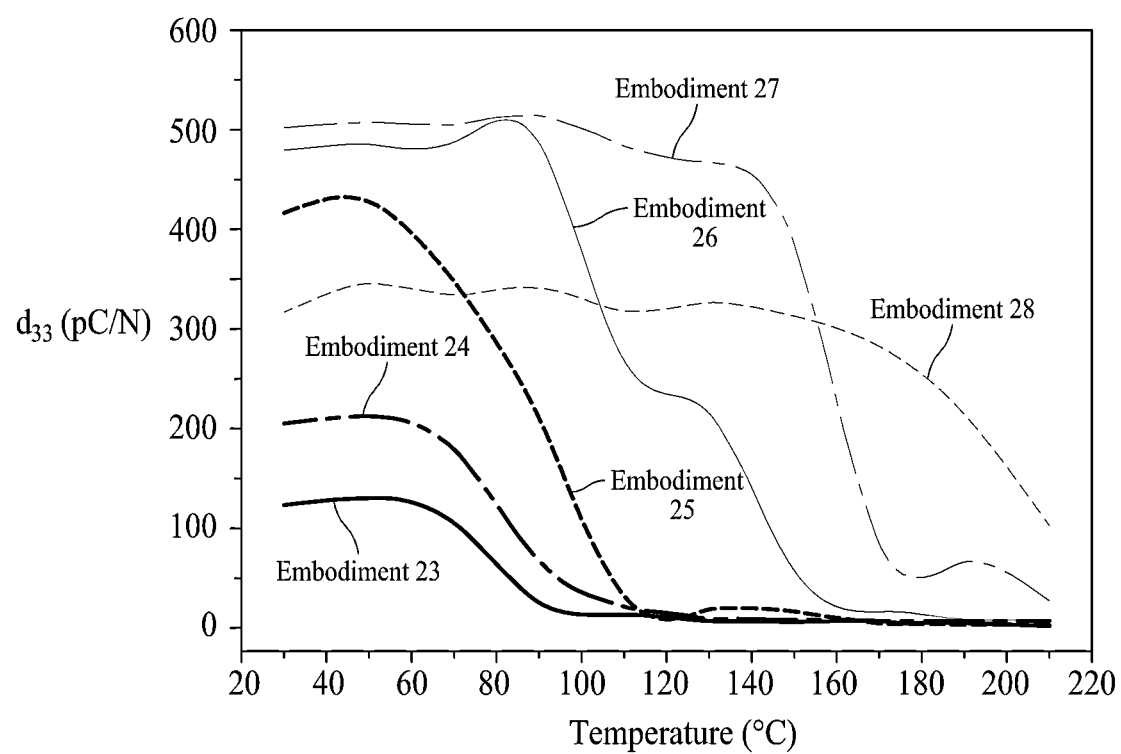
FIG. 10 illustrates a variation of a piezoelectric constant $d_{33}$ of a piezoelectric element with respect to an annealing temperature.

FIG. 10 is a graph showing a measurement result of a piezoelectric constant $d_{33}$ of a piezoelectric element with respect to an annealing temperature. For example, FIG. 10 is a diagram showing a measurement result of a piezoelectric constant $d_{33}$ of a piezoelectric element according to embodiments 23 to 28 of the present disclosure.

With reference to FIG. 10, a piezoelectric element according to embodiment 27 of the present disclosure where z is 0.04 may have a piezoelectric constant $d_{33}$ of about 500 pC/N and may have a high piezoelectric constant $d_{33}$ of about 400 pC/N at an annealing temperature of about 150° C., and thus, it may be seen that the piezoelectric element has an excellent piezoelectric characteristic. For example, it may be seen that a piezoelectric characteristic is enhanced when z is 0.02 to 0.05 at an annealing temperature of 100° C. or less.

In an embodiment of the present disclosure, a morphotropic phase temperature may vary by changing a composition of Li—Na—K—Nb—Sb (LNKNS) and Ca—Zr (CZ), and thus, a morphotropic phase may occur in the piezoelectric element at room temperature. Therefore, when an electric field is applied to the piezoelectric element according to an embodiment of the present disclosure, polarization may be efficiently performed and the piezoelectric element may have a large piezoelectric constant. Accordingly, the piezoelectric element according to an embodiment of the present disclosure may have an excellent piezoelectric characteristic and a vibration characteristic.

Moreover, according to an embodiment of the present disclosure, a morphotropic phase temperature may vary by changing a composition of Li—Na—K—Nb—Sb (LNKNS) and Ca—Zr (CZ) constituting the piezoelectric element, and thus, a morphotropic phase may be maintained at a high temperature. Accordingly, the piezoelectric element according to an embodiment of the present disclosure may have a large piezoelectric constant despite the high temperature and may have an excellent piezoelectric characteristic despite the high temperature.

The piezoelectric element according to an embodiment of the present disclosure may have a large piezoelectric constant at a high temperature of about 150° C., and thus, may have an excellent piezoelectric characteristic at a high temperature as well as at room temperature.

The piezoelectric element according to an embodiment of the present disclosure, having an excellent piezoelectric characteristic at a high temperature as well as at room temperature, may include a compound represented by Formula 1 and may include CuO.

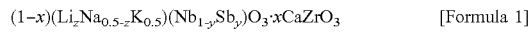

[Formula 1]

In Formula 1, x, y, and z may respectively have a range of 0.001≤x≤0.2, a range of 0≤y≤0.5, and a range of 0≤z≤0.2.

A range of each of x, y, and z of Formula 1 may be adjusted so that the piezoelectric element according to an embodiment of the present disclosure has a morphotropic phase boundary (MPB) at room temperature and a high temperature.

The piezoelectric element according to an embodiment of the present disclosure may not include Pb, and thus, may be ecofriendly, may have a high piezoelectric constant of about 500 pC/N on the basis of a morphotropic phase, and may maintain a high piezoelectric constant at a high temperature of about 150° C. Accordingly, a piezoelectric element with secured piezoelectric characteristic may be provided.

According to an embodiment of the present disclosure, $CaZrO_3$ and $Li_zNa_{0.5-z}K_{0.5}Nb_{1-y}Sb_yO_3$ may form a solid solution. That is, $CaZrO_3$ may be applied to $Li_zNa_{0.5-z}K_{0.5}Nb_{1-y}Sb_yO_3$. As the amount of $CaZrO_3$ applied to $Li_zNa_{0.5-z}K_{0.5}Nb_{1-y}Sb_yO_3$, a Curie temperature Tc of the piezoelectric element according to an embodiment of the present disclosure may decrease, and a morphotropic phase temperature $T_{O-T}$ of the orthorhombic structure and the tetragonal structure may move to be close to room temperature. Accordingly, a piezoelectric constant $d_{33}$ and a value of an electrical-mechanical coupling coefficient of the piezoelectric element may increase.

When a content of $CaZrO_3$ increases to be more than a certain range, a permittivity of the piezoelectric element is rapidly lowered, a morphotropic phase region of the orthorhombic structure and the tetragonal structure is removed, and phase transition is performed in the cubic structure at room temperature. Due to this, a piezoelectric characteristic is reduced. When a content of $CaZrO_3$ is an excessive amount, the piezoelectric characteristic of the piezoelectric element may be reduced.

Therefore, according to an embodiment of the present disclosure, x representing a content of $CaZrO_3$ may have a range of 0.001≤x≤0.2.

In order to implement a PPB, x may have a range of 0.001≤x≤0.15. For example, x may have a range of 0.001≤x≤0.1. Alternatively, x may be 0.001≤x≤0.03.

In Formula 1, "y" represents a degree to which Nb is substituted with Sb. According to an embodiment of the present disclosure, Nb may not be substituted with Sb (y=0).

When a portion of Nb is substituted with Sb, and Sb is applied to a position of Nb, the Curie temperature Tc is rapidly lowered and the morphotropic phase temperature $T_{O-T}$ of the orthorhombic structure and the tetragonal structure is lowered. However, the morphotropic phase temperature $T_{O-T}$ is relatively slowly lowered. When the amount of applied Sb increases, a region of the tetragonal structure is progressively narrowed, and when the amount of applied Sb reaches a threshold value, a region of the tetragonal structure is completely removed. Also, when a content of Sb is higher than a content of Nb, a piezoelectric characteristic of the piezoelectric element is reduced.

Therefore, according to an embodiment of the present disclosure, y may have a range of 0≤y≤0.5. In order to smoothly form a morphotropic phase region, y may have a range of 0≤y≤0.3. For example, y may have a range of 0≤y≤0.2.

For example, when 0≤y≤0.02, the piezoelectric element according to an embodiment of the present disclosure may have the orthorhombic structure, and when 0.02≤y≤0.06, the piezoelectric element may have a morphotropic phase structure (orthorhombic-tetragonal PPB) of the orthorhombic structure and the tetragonal structure. When 0.06<y<0.08, the piezoelectric element may have a morphotropic phase structure (orthorhombic-tetragonal-pseudocubic PPB) of the orthorhombic structure, the tetragonal structure, and the pseudocubic structure. When 0.08≤y<0.095, the piezoelectric element may have a morphotropic phase structure (orthorhombic-pseudocubic PPB) of the orthorhombic structure and the pseudocubic structure. When y≥0.095, the piezoelectric element may have the pseudocubic structure. Accordingly, according to an embodiment of the present disclosure, y may have, for example, a range of 0.02≤y<0.095. Also, y may be 0.07≤y≤0.2, and in more detail, may be 0.07≤y≤0.11.

In Formula 1, "z" represents a degree to which Na is substituted with Li. According to an embodiment of the present disclosure, Na may not be substituted with Li (z=0).

According to an embodiment of the present disclosure, even when y of Formula 1 is more than 0.1, the piezoelectric element may have a morphotropic phase structure by adjusting a content of Li substituted with Na. For example, when y is more than 0.1, the piezoelectric element may have the pseudocubic structure, but when a content of Li substituted with Na increases, the tetragonal may be again formed instead of the pseudocubic structure, and thus, the Curie temperature Tc may increase.

When a content of Li substituted with Na increases excessively, the piezoelectric characteristic of the piezoelectric element may be reduced.

According to an embodiment of the present disclosure, z may have a range of 0≤z≤0.2. In order to smoothly form a morphotropic phase region, z may have a range of 0≤z≤0.15. In more detail, z may have a range of 0≤z≤0.1.

According to an embodiment of the present disclosure, in a piezoelectric element where y is 0.11, when Na is substituted with Li and thus z is 0.02 to 0.03, an orthorhombic-pseudocubic PPB structure of the orthorhombic structure and the pseudocubic structure may be formed in the piezoelectric element When z is 0.04, an orthorhombic-tetragonal-pseudocubic PPB structure of the orthorhombic structure, the tetragonal structure, and the pseudocubic structure may be formed in the piezoelectric element. Also, when z is 0.05, an orthorhombic-tetragonal PPB structure of the orthorhombic structure and the tetragonal structure may be formed in the piezoelectric element. Accordingly, z may have a range of 0.02≤z≤0.05. In more detail, z may have a range of 0.01≤z≤0.05.

According to an embodiment of the present disclosure, CuO may act as a low temperature sintering agent for lowering a sintering temperature of a piezoelectric element. For example, in a case where a piezoelectric element is formed based on sintering of Formula 1, a liquid phase is formed through a reaction between copper (Cu) and Nb, and the liquid phase may enable the piezoelectric element to be smoothly sintered.

For example, when a piezoelectric element is sintered at a high temperature, Na and K may be volatilized to $Na_2O$ and $K_2O$ at a high temperature. When CuO is added to the piezoelectric element, a sintering temperature of the piezoelectric element is lowered, and thus, the amount of volatilized Na and K is largely reduced. Therefore, it is easy to adjust a content of Na and K in the piezoelectric element, and thus, it is easy to manufacture a piezoelectric element having a desired composition. Also, a sintering temperature may be lowered by adding CuO, and due to this, a process temperature may be lowered, causing a reduction in the process cost.

When a content of CuO is more than 10 parts by weight with respect to 100 parts by weight of the piezoelectric element, a piezoelectric characteristic of the piezoelectric element may be reduced due to an excessive amount of CuO.

Therefore, according to an embodiment of the present disclosure, CuO may have a content which is equal to or less than 10 parts by weight with respect to 100 parts by weight of Formula 1. For example, CuO may have a content which is more than 0 parts by weight and equal to or less than 10 parts by weight with respect to 100 parts by weight of the piezoelectric element.

In order to secure a better piezoelectric characteristic, CuO may have a content which is equal to or less than 5 parts by weight with respect to 100 parts by weight of Formula 1. For example, CuO may have a content which is more than 0 parts by weight and equal to or less than 5 parts by weight with respect to 100 parts by weight of the piezoelectric element.

Figure 11:
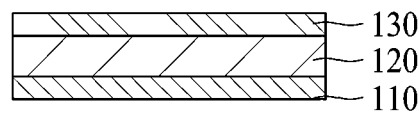
FIG. 11 is a cross-sectional view of a piezoelectric device according to another embodiment of the present disclosure.

FIG. 11 is a cross-sectional view of a piezoelectric device 100 according to another embodiment of the present disclosure.

The piezoelectric device 100 according to another embodiment of the present disclosure may include a first electrode 110, a piezoelectric element layer 120 on the first electrode 110, and a second electrode 130 on the piezoelectric element layer 120.

The first electrode 110 and the second electrode 130 may be disposed apart from each other with the piezoelectric element layer 120 therebetween and at least a portion thereof may overlap. The first electrode 110 and the second electrode 130 may include a metal material having a low resistance and an excellent heat dissipation characteristic. Another embodiment of the present disclosure is not limited thereto, and the first electrode 110 and the second electrode 130 may include transparent conductive oxide or a conductive polymer. For example, the first electrode 110 and the second electrode 130 may include at least one or more of metal including silver (Ag), magnesium (Mg), aluminum (Al), copper (Cu), platinum (Pt), palladium (Pd), gold (Au), nickel (Ni), Nd, iridium (Ir), and chromium (Cr), a transparent conductive oxide including ITO (InSnO), IZO (InZnO), IZTO (InZnSnO), ZnO, and $In_2O_3$, and a conductive polymer including polyaniline, polypyrrole, and polythiophene.

The piezoelectric element layer 120 may include a piezoelectric element. The piezoelectric element layer 120 may include a piezoelectric element. The piezoelectric element may generate a vibration based on an electric field. For example, when pressure or twisting is applied to a crystalline structure of the piezoelectric element by an external force, a potential difference may occur in the piezoelectric element due to dielectric polarization based on a relative position change of a positive (+) ion and a negative (−) ion. On the other hand, when an electric field is applied to the piezoelectric element, a vibration may be generated.

According to another embodiment of the present disclosure, the piezoelectric element may include the compound represented by Formula 1 and CuO.

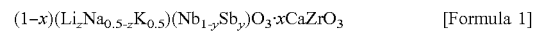

$(1-x)(Li_zNa_{0.5-z}K_{0.5})(Nb_{1-y}Sb_y)O_3 \cdot xCaZrO_3$ [Formula 1]

In Formula 1, x, y, and z may respectively have a range of 0.001≤x≤0.2, a range of 0≤y≤0.5, and a range of 0≤z≤0.2.

Hereinafter, a description of a piezoelectric element may be omitted for avoiding a repetitive description.

Figure 12:
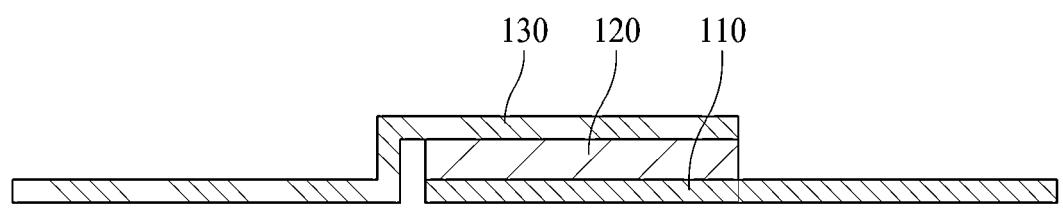
FIG. 12 is a cross-sectional view of a piezoelectric device according to another embodiment of the present disclosure.

FIG. 12 is a cross-sectional view of a piezoelectric device 200 according to another embodiment of the present disclosure.

The piezoelectric device 200 according to another embodiment of the present disclosure may include a first electrode 110, a piezoelectric element layer 120 on the first electrode 110, and a second electrode 130 on the piezoelectric element layer 120.

With reference to FIG. 12, the first electrode 110 and/or the second electrode 130 may each extend to a region other than a region overlapping the piezoelectric element layer 120. A portion of each of the first electrode 110 and the second electrode 130, which extend to a region other than a region overlapping the piezoelectric element layer 120, may be a pad connected to an external terminal.

Another embodiment of the present disclosure is not limited thereto. For example, the first electrode 110 and the second electrode 130 may have different shapes. The first electrode 110 and the second electrode 130 may each have a structure stacked as a multiplayer, and a plurality of piezoelectric element layers 120 may be disposed between the first electrode 110 and the second electrode 130.

Another embodiment of the present disclosure may provide a vibration module 300 including the piezoelectric device 100.

Figure 13:
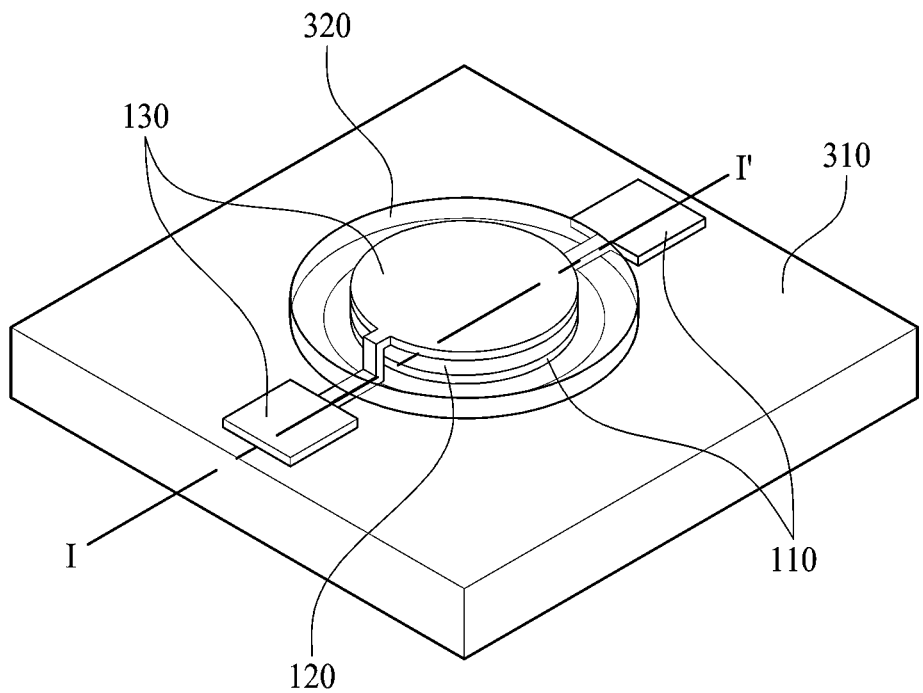
FIG. 13 is a perspective view of a vibration module according to another embodiment of the present disclosure.
Figure 14:
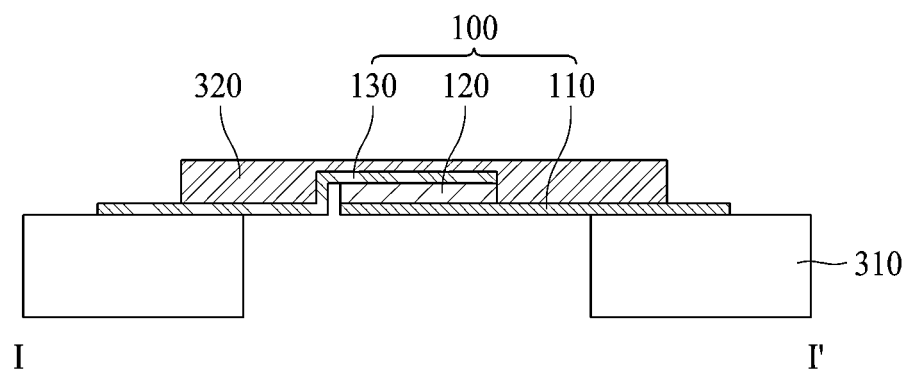
FIG. 14 is a cross-sectional view taken along line I-I' of FIG. 13.

FIG. 13 is a perspective view of a vibration module 300 according to another embodiment of the present disclosure, and FIG. 14 is a cross-sectional view taken along line I-I' of FIG. 13.

The vibration module 300 according to another embodiment of the present disclosure may include a piezoelectric device 100 and a vibration member 320 on the piezoelectric device 100. The piezoelectric device 100 may include a first electrode 110, a piezoelectric element layer 120 on the first electrode 110, and a second electrode 130 on the piezoelectric element layer 120, and the vibration member 320 may be disposed on the second electrode 130.

With reference to FIG. 14, the first electrode 110 may be disposed on a substrate 310. The piezoelectric element layer 120 may be disposed on the first electrode 110. The second electrode 130 may be disposed on the piezoelectric element layer 120. The vibration member 320 may be disposed on the second electrode 130. However, embodiments of the present disclosure are not limited thereto, and a vibration module including the piezoelectric device 100 of FIG. 11 may be provided on the substrate 310.

The piezoelectric element layer 120 may include a piezoelectric element, and the piezoelectric element may include the compound represented by Formula 1 and CuO.

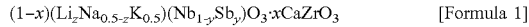  [Formula 1]

In Formula 1, x, y, and z may respectively have a range of 0.001≤x≤0.2, a range of 0≤y≤0.5, and a range of 0≤z≤0.2.

The substrate 310 may support the piezoelectric device 100. An empty space may be formed at a portion of the substrate 310 overlapping the piezoelectric device 100. The substrate 310 may support an edge or a periphery of the piezoelectric device 100. Based on the space formed in the substrate 310, a vibration of the piezoelectric device 100 may be smoothly generated and the sound generating efficiency of the piezoelectric device 100 may be enhanced.

The vibration member 320 may cover and surround a side surface and a top surface of the piezoelectric device 100. However, embodiments of the present disclosure are not limited thereto, and the vibration member 320 may be disposed on the piezoelectric device 100.

A vibration, generated by the piezoelectric device 100 based on a voltage or an electric field each applied thereto, may be transferred to the vibration member 320 surrounding the piezoelectric device 100 to vibrate the vibration member 320. The vibration member 320 may vibrate to push out air of an upper portion and a lower portion of the vibration member 320, thereby generating a sound.

The vibration module 300 according to another embodiment of the present disclosure may generate a sound, and thus, may be used as a speaker or a receiver.

Another embodiment of the present disclosure may provide a display apparatus 400 including the piezoelectric device 100.

Figure 15:
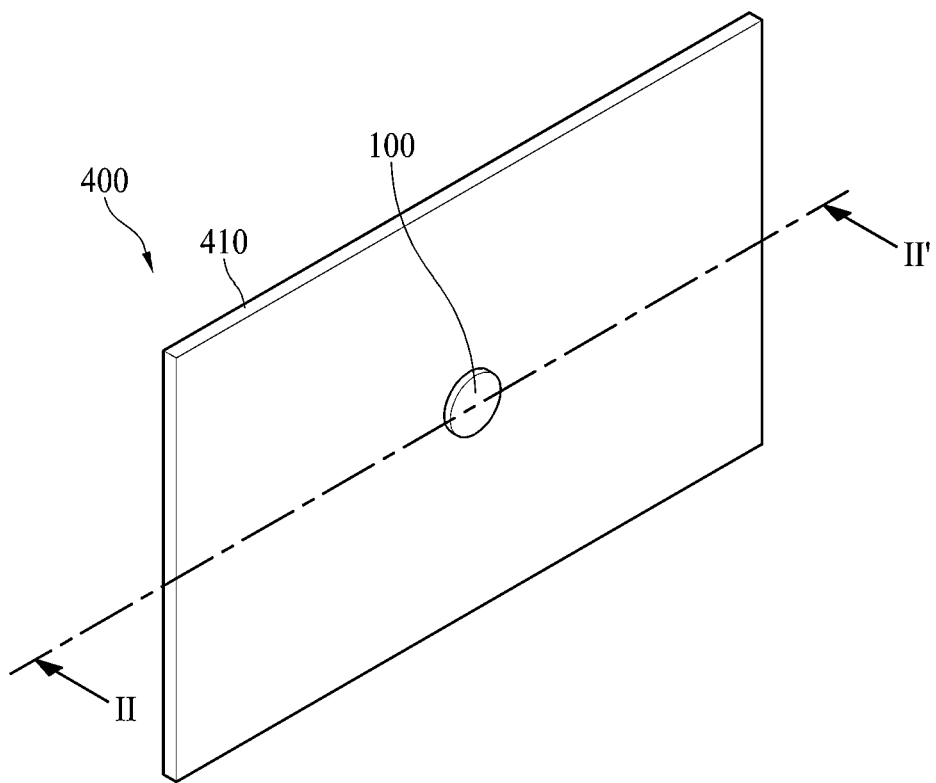
FIG. 15 is a perspective view of a display apparatus according to another embodiment of the present disclosure.
Figure 16A:
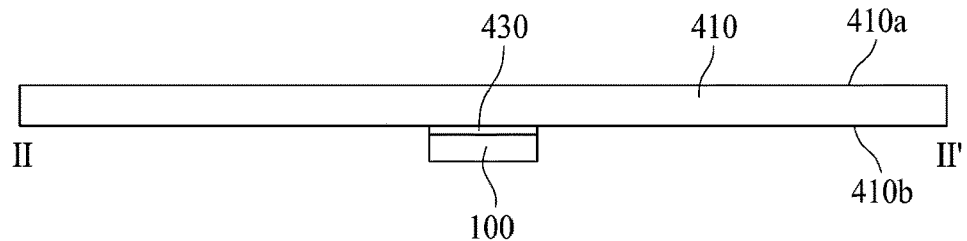
FIG. 16A is a cross-sectional view taken along line II-II' of FIG. 15.

FIG. 15 is a perspective view of a display apparatus 400 according to another embodiment of the present disclosure, and FIG. 16A is a cross-sectional view taken along line II-IF of FIG. 15.

The display apparatus 400 according to another embodiment of the present disclosure may include a display panel 410 and a piezoelectric device 100 disposed in the display panel 410.

The piezoelectric device 100 may include a first electrode 110, a piezoelectric element layer 120 on the first electrode 110, and a second electrode 130 on the piezoelectric element layer 120.

The piezoelectric element layer 120 may include a piezoelectric element which generates a vibration based on an electric field applied thereto. The piezoelectric element may include the compound represented by Formula 1 and CuO.

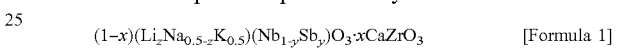  [Formula 1]

In Formula 1, x, y, and z may respectively have a range of 0.001≤x≤0.2, a range of 0≤y≤0.5, and a range of 0≤z≤0.2.

The display panel 410 may include a display surface 410a which displays a screen or an image and a rear surface 410b opposite to the display surface 410a. The piezoelectric device 100 may be disposed on the rear surface 410b of the display panel 410. The piezoelectric device 100 may be disposed at a portion of the display panel 410, but is not limited thereto. For example, the piezoelectric device 100 may be disposed to have the same size as that of the display panel 410, or may be disposed to have a size which is less than that of the display panel 410.

According to another embodiment of the present disclosure, the piezoelectric device 100 may vibrate the display panel 410 to generate a sound. For example, the piezoelectric device 100 may vibrate the display panel 410 to generate a sound in a forward direction with respect to the display panel 410. The display panel 410 may act as a vibration plate, and thus, may vibrate based on a vibration of the piezoelectric device 100 to generate a sound. Accordingly, a sound may be generated in a forward direction with respect to the display apparatus, thereby enhancing the immersion experience of a user or a viewer of the display apparatus.

According to another embodiment of the present disclosure, a shape or a size of the display panel 410 is not limited. The display panel 410 according to another embodiment of the present disclosure may use all types of display panels for generating a sound based on a vibration of the piezoelectric device 100. The display panel 410 may include, for example, a liquid crystal display panel, an organic light emitting diode (OLED) display panel, and an electroluminescence display panel. As another example, the display panel 410 may include a quantum dot light emitting display panel, a micro light emitting diode display panel, and a curved display panel.

A separate member for attaching or mounting the piezoelectric device 100 on the display panel 410 may be used. With reference to FIG. 16A, the piezoelectric device 100 may be attached on the display panel 410 by an adhesive member 430. The adhesive member 430 may include, for example, an adhesive or an adhesive sheet.

Figure 16B:
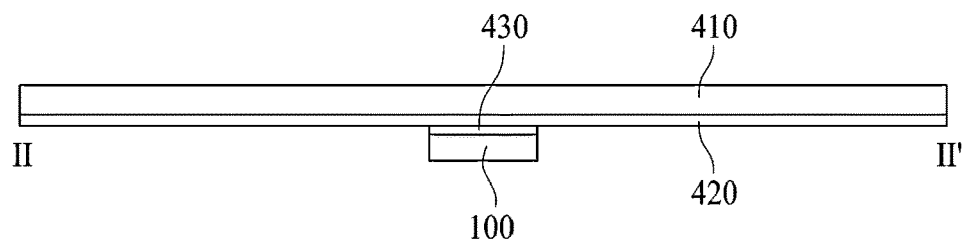
FIG. 16B is a cross-sectional view of a display apparatus according to another embodiment of the present disclosure.

FIG. 16B is a cross-sectional view of a display apparatus according to another embodiment of the present disclosure. With reference to FIG. 16B, a vibration plate 420 may be disposed at a display panel 410, and a piezoelectric device 100 may be attached or mounted on the vibration plate 420. A size of the vibration plate 420 may be the same as that of the display panel 410, but is not limited thereto. For example, a size of the vibration plate 420 may be less than that of the display panel 410. The piezoelectric device 100 may be disposed at a portion of the display panel 410, but is not limited thereto. For example, the piezoelectric device 100 may be disposed to have the same size as that of the display panel 410, or may be disposed to have a size which is less than that of the display panel 410.

Figure 17:
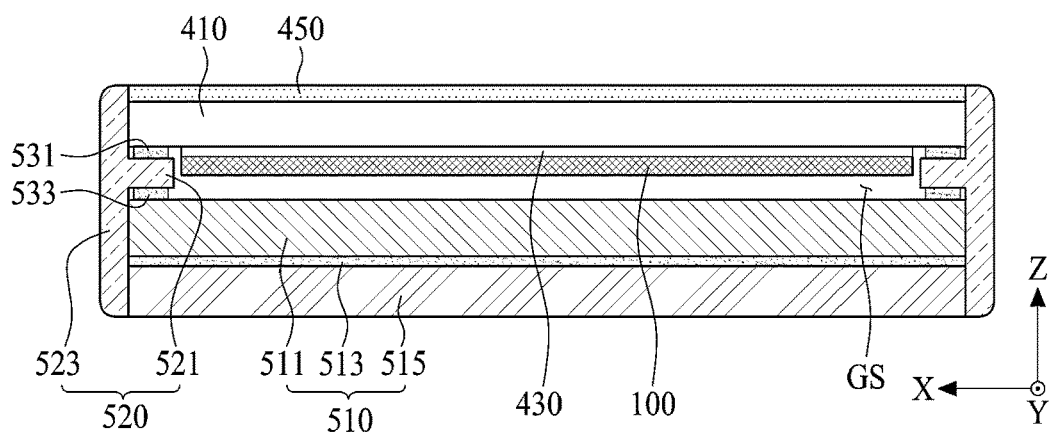
FIG. 17 is a cross-sectional view of a display apparatus according to another embodiment of the present disclosure.

FIG. 17 is a cross-sectional view of a display apparatus 500 according to another embodiment of the present disclosure.

The display apparatus 500 of FIG. 17 may include a display panel 410, an adhesive member 430, and a piezoelectric device 100.

The display panel 410 may include all types of display panels or curved display panels such as liquid crystal display panels, organic light emitting display panels, quantum dot light emitting display panels, micro light emitting diode display panels, and electrophoresis display panels. Any display panel, which are vibrated by the piezoelectric device 100 to generate a sound wave (or a sound) or to generate a haptic feedback responding to a touch, may be used as the display panel 410 according to another embodiment of the present disclosure.

The display panel 410 may include a thin film transistor (TFT) array substrate which includes a plurality of pixels defined by a plurality of gate lines and a plurality of data lines and a plurality of TFTs provided in the plurality of pixels to drive the plurality of pixels, a light emitting device layer which is provided on the TFT array substrate, and an encapsulation layer which covers the light emitting device layer. The encapsulation layer may protect the TFTs and the light emitting device layer from an external impact and may prevent water from penetrating into the light emitting device layer.

The display panel 410 may include a display area which displays an image based on driving of each of the plurality of pixels and a non-display area which surrounds the display area.

The display panel 410 may include a bending portion which is bent or curved to have a curve shape or a certain curvature radius.

The display apparatus according to another embodiment of the present disclosure may further include a functional film 450 disposed on the display panel 410.

The functional film 450 may be disposed on a front surface of the display panel 410. The functional film 450 may be attached on the front surface of the display panel 410 by a film adhesive member. For example, the film adhesive member may include a pressure sensitive adhesive (PSA), an optically cleared adhesive (OCA), or an optically cleared resin (OCR).

The functional film 450 may include at least one of an anti-reflection layer (or an anti-reflection film) for preventing reflection of external light, a barrier layer (or a barrier film) for primarily preventing penetration of water (or moisture) or oxygen, and a light path control layer (or a light path control film) for controlling a path (or a viewing angle) of light.

The display apparatus 500 according to another embodiment of the present disclosure may further include a touch panel (or a touch electrode layer) for sensing a user touch applied to the display panel 410. For example, the touch panel may be disposed to overlap the display area and may sense the user touch applied to the display panel 410. For example, the touch panel may be disposed in the display panel 410, or may be disposed between the display panel 410 and the functional film 450. The touch panel may include a plurality of touch electrodes for sensing a variation of a capacitance based on the user touch.

The piezoelectric device 100 may be disposed on a rear surface (or a backside surface) of the display panel 410 and may vibrate the display panel 410. The piezoelectric device 100 may be implemented as a thin film type which has various natural vibration numbers (or natural frequencies) based on a piezoelectric characteristic and has relatively high flexibility. The piezoelectric device 100 may have a thickness which is thinner than that of the display panel 410. The piezoelectric device 100 may be referred to as a sound generating module, a sound generating device, a vibration module, an actuator, a piezoelectric composite actuator, a speaker, a piezoelectric speaker, or a piezoelectric composite speaker, which uses the display panel 410 as a vibration plate, but the terms are not limited thereto.

The piezoelectric device 100 may vibrate based on an electrical signal to vibrate the display panel 410 at various frequencies. For example, the piezoelectric device 100 may vibrate based on a voice signal synchronized with an image displayed by the display panel 410 to vibrate the display panel 410, and a sound may be generated by the display panel 410 based on the vibration of the display panel 410. Also, the piezoelectric device 100 may vibrate based on a haptic feedback signal (or a tactile feedback signal) synchronized with a user touch applied to the touch panel disposed in the display panel 410 to vibrate the display panel 410. Accordingly, the display panel 410 may vibrate based on a vibration of the piezoelectric device 100 to provide a user (or a viewer) with at least one of a sound and a haptic feedback.

According to another embodiment of the present disclosure, the piezoelectric device 100 may have a size corresponding to the display area of the display panel 410. For example, the piezoelectric device 100 may have a size similar to the display area of the display panel 410. For example, a size of the piezoelectric device 100 may be 0.9 to 1.1 times a size of the display area of the display panel 410, but is not limited thereto. For example, since the piezoelectric device 100 has a size which is the same as or similar to that of the display area of the display panel 410, the piezoelectric device 100 may cover the most area of the display panel 410, and a vibration generated by the piezoelectric device 100 may vibrate a whole portion of the display panel 410, thereby increasing a sense of localization of a sound and improving satisfaction of a user or a viewer. Also, a contact area between the display panel 410 and the piezoelectric device 100 may increase, and thus, a vibration region of the display panel 410 may increase, thereby improving a sound of a low-pitched sound band generated based on a vibration of the display panel 410. A high-pitched sound band may be 3 kHz or more, a middle-pitched sound band may be 200 Hz to 3 kHz, and the low-pitched sound band may be 200 Hz or less. However, embodiments of the present disclosure are not limited thereto.

The piezoelectric device 100 according to another embodiment of the present disclosure may be attached on the rear surface or back surface of the display panel 410 by the adhesive member 430.

According to another embodiment of the present disclosure, the adhesive member 430 may be disposed between the rear surface of the display panel 410 and the piezoelectric device 100. The adhesive member 430 may include a double-sided tape or an adhesive including an adhesive layer having a good adhesive force between the rear surface of the display panel 410 and the piezoelectric device 100. For example, the adhesive layer of the adhesive member 430 may include epoxy, acryl, silicon, or urethane, but is not limited thereto. The adhesive layer of the adhesive member 430 may further include an additive such as a tackifier, a wax component, or an antioxidant, and the additive may prevent the adhesive member 430 from being detached (striped) from the display panel 410 due to a vibration of the piezoelectric device 100.

According to another embodiment of the present disclosure, the adhesive member 430 may further include a hollow portion disposed between the display panel 410 and the piezoelectric device 100. The hollow portion of the adhesive member 430 may form an air gap between the display panel 410 and the piezoelectric device 100. The air gap may allow a sound wave (or a sound pressure) based on a vibration of the piezoelectric device 100 to concentrate on the display panel 410 without being dispersed by the adhesive member 430, and thus, may minimize or decrease loss of a vibration caused by the adhesive member 430, thereby increasing a sound pressure characteristic of a sound generated based on a vibration of the display panel 410.

The display apparatus 500 according to another embodiment of the present disclosure may further include a rear structure 510 which supports the display panel 410. For example, the rear structure 510 may be disposed on a rear surface of the display panel 410.

The rear structure 510 may be referred to as another term such as a rear cover, a cover bottom, a plate bottom, a back cover, a base frame, a metal frame, a metal chassis, a chassis base, or an m-chassis, but is not limited thereto. Accordingly, the rear structure 510 may be a supporter which supports the display panel 410 and may be implemented as any type of frame or plate structure disposed on the rear surface of the display panel 410.

With reference to FIG. 17, the rear structure 510 may include a first rear cover 511 and a second rear cover 515.

The first rear cover 511 may be a plate member which covers the whole rear surface of the display panel 410. The first rear cover 511 may be spaced apart from a rearmost surface of the display panel 410 with a gap space GS therebetween. For example, the gap space GS may be referred to as an air gap, a vibration space, or a sound box, but the terms are not limited thereto.

The second rear cover 515 may be a plate member which is disposed on a rear surface of the first rear cover 511 to cover a whole rear surface of the first rear cover 511.

According to another embodiment of the present disclosure, the first rear cover 511 may be coupled or connected to the second rear cover 515 by a coupling member or connection member 513. For example, the coupling member 513 may include an adhesive resin, a double-sided tape, or a double-sided foam pad and may have elasticity for absorbing an impact. With reference to FIG. 17, the coupling member 513 may be disposed in a whole region between the first rear cover 511 and the second rear cover 515. As another example, the coupling member 513 may be formed in a mesh structure having an air gap between the first rear cover 511 and the second rear cover 515.

The display apparatus 500 according to another embodiment of the present disclosure may further include a middle frame 520.

The middle frame 520 may support an edge or a periphery of each of the display panel 410 and the rear structure 510 and may surround a side surface of each of the display panel 410 and the rear structure 510. Also, a portion of the middle frame 520 may be disposed between a rear edge or a rear periphery of the display panel 410 and a front edge or a front periphery of the rear structure 510. The middle frame 520 may provide a gap space (GS) between the display panel 410 and the rear structure 510. The middle frame 520 may be referred to as a middle cabinet, a middle cover, or a middle chassis, but the terms are not limited thereto.

With reference to FIG. 17, the middle frame 520 may include a supporting portion 521 and a sidewall portion 523.

The supporting portion 521 may be disposed between the rear edge or rear periphery of the display panel 410 and the front edge or front periphery of the rear structure 510 and may provide a gap space GS between the display panel 410 and the rear structure 510. A front surface of the supporting portion 521 may be coupled or connected to the rear edge or rear periphery of the display panel 410 by a first adhesive member 531, and a rear surface of the supporting portion 521 may be coupled or connected to the front edge or front periphery of the rear structure 510 by a second adhesive member 533. For example, the supporting portion 521 may have a single frame structure having a tetragonal shape, or may have a plurality of division bar shapes.

The sidewall portion 523 may be vertically coupled or connected to an outer surface of the supporting portion 521 in parallel with a thickness direction Z of the display apparatus. The sidewall portion 523 may surround all of an outer surface of the display panel 410 and an outer surface of the rear structure 510, and thus, may protect the outer surface of each of the display panel 410 and the rear structure 510.

The supporting portion 521 and the sidewall portion 523 may be coupled or connected to each other to form a single body, and thus, the middle frame 520 according to another embodiment of the present disclosure may have a frame structure having a convex shaped cross-sectional structure.

The display apparatus 500 according to another embodiment of the present disclosure may include a panel coupling member or panel connection member instead of the middle frame 520. The panel coupling member may be disposed between the rear edge or rear periphery of the display panel 410 and the front edge or front periphery of the rear structure 510, and thus, may provide a gap space GS between the display panel 410 and the rear structure 510. The panel coupling member may be disposed between the rear edge or rear periphery of the display panel 410 and an edge or a periphery of the rear structure 510 and may attach the display panel 410 on the rear structure 510. For example, the panel coupling member may be implemented with a double-sided tape, a single-sided tape, or a double-sided adhesive foam pad, but is not limited thereto.

Therefore, the display apparatus 500 according to another embodiment of the present disclosure may output a sound, generated based on a vibration of the display panel 410 caused by a vibration of the piezoelectric device 100 disposed on the rear surface of the display panel 410, in a forward direction (FD) with respect to the display panel 410, thereby enhancing the immersion experience of a viewer who is watching an image displayed by the display panel 410. Also, even without providing a separate haptic driving device, the display apparatus 500 according to another embodiment of the present disclosure may vibrate the display panel 410 on the basis of a vibration of the piezoelectric device 100 disposed on the rear surface of the display panel 410 to provide a user with a haptic feedback responding to a user touch applied to the display panel 410.

The piezoelectric element according to embodiments of the present disclosure may be applied to a sound generating device disposed in a display apparatus. A display apparatus according to embodiments of the present disclosure may be applied to mobile apparatuses, video phones, smart watches, watch phones, wearable apparatuses, foldable apparatuses, rollable apparatuses, bendable apparatuses, flexible apparatuses, curved apparatuses, portable multimedia players (PMPs), personal digital assistants (PDAs), electronic organizers, desktop personal computers (PCs), laptop PCs, netbook computers, workstations, navigation apparatuses, automotive navigation apparatuses, automotive display apparatuses, TVs, wall paper display apparatuses, signage v, game machines, notebook computers, monitors, cameras, camcorders, home appliances, etc. Also, the vibration module according to embodiment of the present disclosure may be applied to organic light emitting lighting apparatuses or inorganic light emitting lighting apparatuses. When the vibration module according to embodiments of the present disclosure is applied to a lighting apparatus, the vibration module may act as lighting and a speaker. Also, when the vibration module according to embodiments of the present disclosure is applied to a mobile apparatus, the vibration module may act as a speaker or a receiver, but is not limited thereto.

A piezoelectric element, a piezoelectric device, a vibration module, and a display apparatus according to embodiments of the present disclosure will be described below.

A piezoelectric element according to an embodiment of the present disclosure comprises a compound represented by Formula 1,

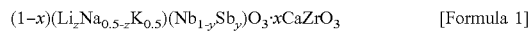　　　　　　[Formula 1]

where x, y, and z have a range of $0 \leq x \leq 0.2$, a range of $0 \leq y \leq 0.5$, and a range of $0 \leq z \leq 0.2$, respectively.

According to some embodiments of the present disclosure, x may be $0.001 \leq x \leq 0.2$.

According to some embodiments of the present disclosure, x may be $0.001 \leq x \leq 0.15$.

According to some embodiments of the present disclosure, x may be $0.001 \leq x \leq 0.1$.

According to some embodiments of the present disclosure, x may be $0.001 \leq x \leq 0.03$.

According to some embodiments of the present disclosure, y may be $0 \leq y \leq 0.3$.

According to some embodiments of the present disclosure, y may be $0 \leq y \leq 0.2$.

According to some embodiments of the present disclosure, y may be $0.07 \leq y \leq 0.2$.

According to some embodiments of the present disclosure, y may be $0.07 \leq y \leq 0.11$.

According to some embodiments of the present disclosure, z may be $0 \leq z \leq 0.15$.

According to some embodiments of the present disclosure, z may be $0 \leq z \leq 0.1$.

According to some embodiments of the present disclosure, z may be $0.01 \leq z \leq 0.05$.

According to some embodiments of the present disclosure, the piezoelectric element may further include copper oxide (CuO).

According to some embodiments of the present disclosure, a content of CuO may be equal to or less than 10 parts by weight with respect to 100 parts by weight of the compound represented by Formula 1.

According to some embodiments of the present disclosure, a content of CuO may be equal to or less than 5 parts by weight with respect to 100 parts by weight of the compound represented by Formula 1.

A piezoelectric element according to an embodiment of the present disclosure comprises a compound represented by Formula 3,

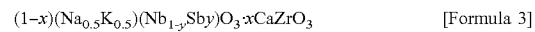　　　　　　[Formula 3]

where x and y have a range of $0.001 \leq x \leq 0.2$ and a range of $0 \leq y \leq 0.5$, respectively.

According to some embodiments of the present disclosure, x may be $0.001 \leq x \leq 0.1$.

According to some embodiments of the present disclosure, y may be $0.07 \leq y \leq 0.2$.

According to some embodiments of the present disclosure, the piezoelectric element may further include copper oxide (CuO), and a content of CuO may be equal to or less than 10 parts by weight with respect to 100 parts by weight of the compound represented by Formula 3.

According to some embodiments of the present disclosure, the piezoelectric element may further include copper oxide (CuO), and a content of CuO may be equal to or less than 5 parts by weight with respect to 100 parts by weight of the compound represented by Formula 3.

A piezoelectric device according to an embodiment of the present disclosure includes a first electrode, a piezoelectric element layer on the first electrode, the piezoelectric element layer including a piezoelectric element, and a second electrode on the piezoelectric element, wherein the piezoelectric element comprises a compound represented by Formula 1,

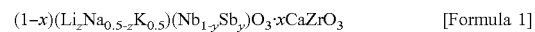　　　　　　[Formula 1]

where x, y, and z have a range of $0.001 \leq x \leq 0.2$, a range of $0 \leq y \leq 0.5$, and a range of $0 \leq z \leq 0.2$, respectively.

According to some embodiments of the present disclosure, the piezoelectric element may further include copper oxide (CuO).

A vibration module according to an embodiment of the present disclosure includes a first electrode, a piezoelectric element layer on the first electrode, a second electrode on the piezoelectric element layer, and a vibration member on the second electrode, wherein the piezoelectric element layer includes a piezoelectric element comprising a compound represented by Formula 1,

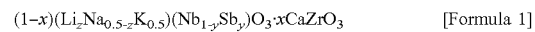　　　　　　[Formula 1]

where x, y, and z have a range of $0.001 \leq x \leq 0.2$, a range of $0 \leq y \leq 0.5$, and a range of $0 \leq z \leq 0.2$, respectively.

According to some embodiments of the present disclosure, the piezoelectric element may further include copper oxide (CuO).

According to an embodiment of the present disclosure, a display apparatus includes a display panel configured to display an image and a piezoelectric device at the display panel, wherein the piezoelectric device includes a first electrode, a piezoelectric element layer on the first electrode, and a second electrode on the piezoelectric element layer, the piezoelectric element layer includes a piezoelectric element comprising a compound represented by Formula 1,

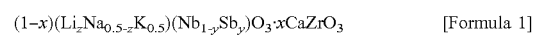　　　　　　[Formula 1]

where x, y, and z have a range of $0.001 \leq x \leq 0.2$, a range of $0 \leq y \leq 0.5$, and a range of $0 \leq z \leq 0.2$, respectively.

According to some embodiments of the present disclosure, the piezoelectric element may further include copper oxide (CuO).

According to some embodiments of the present disclosure, the display panel may include a display surface configured to display the image and a rear surface opposite to the display surface, and the piezoelectric device may be disposed on the rear surface of the display panel.

According to some embodiments of the present disclosure, the display apparatus may further include a touch panel at the display panel, the piezoelectric device may be disposed on a lower surface or an upper surface of the touch panel.

According to some embodiments of the present disclosure, the touch panel may be configured to vibrate based on a vibration of the piezoelectric device, and a haptic feedback may be generated based on the vibration of the touch panel.

According to embodiments of the present disclosure, a piezoelectric element may not include Pb, may have an excellent piezoelectric characteristic, and may maintain an excellent piezoelectric characteristic despite a high temperature.

According to embodiments of the present disclosure, by adjusting a content of metal elements included in the piezoelectric element, a morphotropic phase of the piezoelectric element may vary, and by moving a morphotropic phase temperature of the piezoelectric element, a morphotropic phase region may be formed in the piezoelectric element at a desired temperature. Accordingly, according to the embodiments of the present disclosure, the morphotropic phase region may be formed at room temperature by moving an MPB of an orthorhombic structure, a tetragonal structure, and a pseudocubic structure, thereby providing a piezoelectric element which does not include Pb and has an excellent piezoelectric characteristic and a display apparatus including the piezoelectric element.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A piezoelectric element comprising a compound represented by Formula 3, $$(1-x)(Na_{0.5}K_{0.5})(Nb_{1-y}Sb_y)O_3 \cdot xCaZrO_3 \quad \text{[Formula 3]}$$

where x and y have a range of $0.001 \leq x \leq 0.2$ and a range of $0.01 \leq y \leq 0.11$, respectively, and
a piezoelectric constant $d_{33}$ of the piezoelectric element is 122 pC/N or higher and 518 pC/N or lower.

2. The piezoelectric element of claim 1, wherein the x is $0.001 \leq x \leq 0.15$.

3. The piezoelectric element of claim 1, wherein the x is $0.001 \leq x \leq 0.1$.

4. The piezoelectric element of claim 1, wherein the x is $0.001 \leq x \leq 0.03$.

5. The piezoelectric element of claim 1, wherein the y is $0.04 \leq y \leq 0.11$.

6. The piezoelectric element of claim 1, wherein the y is $0.05 \leq y \leq 0.11$.

7. The piezoelectric element of claim 1, wherein the y is $0.06 \leq y \leq 0.10$.

8. The piezoelectric element of claim 1, wherein y is $0.075 \leq y \leq 0.095$.

9. The piezoelectric element of claim 1, wherein the y is $0.07 \leq y \leq 0.11$.

10. The piezoelectric element of claim 1, further comprising copper oxide (CuO).

11. The piezoelectric element of claim 10, wherein a content of CuO is equal to or less than 10 parts by weight with respect to 100 parts by weight of the compound represented by Formula 3.

12. The piezoelectric element of claim 10, wherein a content of CuO is equal to or less than 5 parts by weight with respect to 100 parts by weight of the compound represented by Formula 3.

13. The piezoelectric element of claim 10, wherein the piezoelectric element is obtained by sintering the compound represented by Formula 3 and copper oxide (CuO).

14. The piezoelectric element of claim 1, wherein a Curie temperature Tc is 50° C. or higher and 313° C. or lower.

15. The piezoelectric element of claim 1, wherein a Curie temperature Tc is 50° C. or higher and 134° C. or lower.

16. A piezoelectric device, comprising:
a first electrode;
a piezoelectric element layer on the first electrode, the piezoelectric element layer including a piezoelectric element; and
a second electrode on the piezoelectric element layer, wherein the piezoelectric element comprises a compound represented by Formula 3, $$(1-x)(Na_{0.5}K_{0.5})(Nb_{1-y}Sb_y)O_3 \cdot xCaZrO_3 \quad \text{[Formula 3]}$$

where x and y have a range of $0.001 \leq x \leq 0.2$ and a range of $0.01 \leq y \leq 0.11$, respectively, and
a piezoelectric constant $d_{33}$ of the piezoelectric element is 122 pC/N or higher and 518 pC/N or lower.

17. The piezoelectric device of claim 16, wherein the piezoelectric element further comprises copper oxide (CuO).

18. A vibration module, comprising:
a first electrode;
a piezoelectric element layer on the first electrode;
a second electrode on the piezoelectric element layer; and
a vibration member on the second electrode, wherein:
the piezoelectric element layer includes a piezoelectric element comprising a compound represented by Formula 3, $$(1-x)(Na_{0.5}K_{0.5})(Nb_{1-y}Sb_y)O_3 \cdot xCaZrO_3 \quad \text{[Formula 3]}$$

where x and y have a range of $0.001 \leq x \leq 0.2$ and a range of $0.01 \leq y \leq 0.11$, respectively, and
a piezoelectric constant $d_{33}$ of the piezoelectric element is 122 pC/N or higher and 518 pC/N or lower.

19. The vibration module of claim 18, wherein the piezoelectric element further comprises copper oxide (CuO).

20. A display apparatus, comprising:
a display panel configured to display an image; and
a piezoelectric device at the display panel, wherein:
the piezoelectric device comprises:
a first electrode;
a piezoelectric element layer on the first electrode; and
a second electrode on the piezoelectric element layer, and
the piezoelectric element layer includes a piezoelectric element comprising a compound represented by Formula 3, $$(1-x)(Na_{0.5}K_{0.5})(Nb_{1-y}Sb_y)O_3 \cdot xCaZrO_3 \quad \text{[Formula 3]}$$

where x and y have a range of $0.001 \leq x \leq 0.2$ and a range of $0.01 \leq y \leq 0.11$, respectively, and a piezoelectric constant $d_{33}$ of the piezoelectric element is 122 pC/N or higher and 518 pC/N or lower.

21. The display apparatus of claim 20, wherein the piezoelectric element further comprises copper oxide (CuO).

22. The display apparatus of claim 20, wherein:
   the display panel comprises a display surface configured to display the image and a rear surface opposite to the display surface, and
   the piezoelectric device is on the rear surface of the display panel.

23. The display apparatus of claim 20, further comprising a touch panel on the display panel,
   wherein the piezoelectric device is on a lower surface or an upper surface of the touch panel.

24. The display apparatus of claim 23, wherein the touch panel is configured to vibrate based on a vibration of the piezoelectric device, and a haptic feedback is generated based on the vibration of the touch panel.

\* \* \* \* \*